US010840137B2

(12) United States Patent
Hansen et al.

(10) Patent No.: US 10,840,137 B2
(45) Date of Patent: Nov. 17, 2020

(54) METHODS OF FORMING INTEGRATED CIRCUITS HAVING PARALLEL CONDUCTORS

(71) Applicant: MICRON TECHNOLOGY, INC., Boise, ID (US)

(72) Inventors: Tyler G. Hansen, Boise, ID (US); Ming-Chuan Yang, Meridian, ID (US); Vishal Sipani, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/520,463

(22) Filed: Jul. 24, 2019

(65) Prior Publication Data

US 2019/0348321 A1    Nov. 14, 2019

Related U.S. Application Data

(60) Continuation of application No. 15/973,784, filed on May 8, 2018, now Pat. No. 10,424,506, which is a continuation of application No. 14/887,359, filed on Oct. 20, 2015, now Pat. No. 9,972,532, which is a division of application No. 13/449,452, filed on Apr. 18, 2012, now Pat. No. 9,177,910.

(51) Int. Cl.
| | |
|---|---|
| *H01L 21/768* | (2006.01) |
| *H01L 21/033* | (2006.01) |
| *H01L 21/311* | (2006.01) |
| *H01L 23/522* | (2006.01) |
| *H01L 23/535* | (2006.01) |
| *H01L 23/532* | (2006.01) |

(52) U.S. Cl.
CPC .... *H01L 21/76895* (2013.01); *H01L 21/0337* (2013.01); *H01L 21/31144* (2013.01); *H01L 21/76802* (2013.01); *H01L 21/76838* (2013.01); *H01L 21/76877* (2013.01); *H01L 23/522* (2013.01); *H01L 23/5226* (2013.01); *H01L 23/535* (2013.01); *H01L 21/76816* (2013.01); *H01L 23/5329* (2013.01); *H01L 2924/0002* (2013.01)

(58) Field of Classification Search
None
See application file for complete search history.

(56) References Cited

U.S. PATENT DOCUMENTS

| | | |
|---|---|---|
| 4,808,552 A | 2/1989 | Anderson |
| 5,631,478 A | 5/1997 | Okumura |

(Continued)

*Primary Examiner* — Michelle Mandala
(74) *Attorney, Agent, or Firm* — Dicke, Billig & Czaja, PLLC

(57) ABSTRACT

Methods of forming integrated circuits forming a first conductive structure at a first level of the integrated circuit, forming a first conductor at a second level of the integrated circuit to be in physical and electrical contact with the first conductive structure, forming a second conductor at the second level to be in physical and electrical contact with the first conductive structure and to be parallel to the first conductor, forming a third conductor at the second level to be isolated from the first conductive structure and to be parallel to the first conductor and to the second conductor, and forming a second conductive structure at a third level of the integrated circuit to be in physical and electrical contact with the second conductor and with the third conductor, wherein the second level is between the first level and the third level.

20 Claims, 23 Drawing Sheets

(56) References Cited

U.S. PATENT DOCUMENTS

| | | |
|---|---|---|
| 5,760,477 A | 6/1998 | Cronin |
| 6,060,383 A | 5/2000 | Nogami et al. |
| 6,100,591 A | 8/2000 | Ishii |
| 6,174,803 B1 | 1/2001 | Harvey |
| 7,042,092 B1 | 5/2006 | Yegnashankaran et al. |
| 7,141,881 B2 | 11/2006 | Takayama et al. |
| 7,161,226 B2 | 1/2007 | Chen et al. |
| 7,767,573 B2 | 8/2010 | Tang et al. |
| 7,808,053 B2 | 10/2010 | Haller et al. |
| 7,816,262 B2 | 10/2010 | Juengling |
| 7,923,373 B2 | 4/2011 | Sandhu |
| 2004/0188842 A1 | 9/2004 | Takewaka et al. |
| 2004/0227241 A1 | 11/2004 | Enomoto |
| 2005/0082577 A1 | 4/2005 | Usui |
| 2005/0179134 A1 | 8/2005 | Matsubara |
| 2007/0222053 A1 | 9/2007 | Wei et al. |
| 2009/0243087 A1 | 10/2009 | Nakamura et al. |
| 2011/0084397 A1 | 4/2011 | Lung |
| 2012/0043661 A1 | 2/2012 | Lindsay |
| 2014/0248773 A1 | 9/2014 | Tsai |

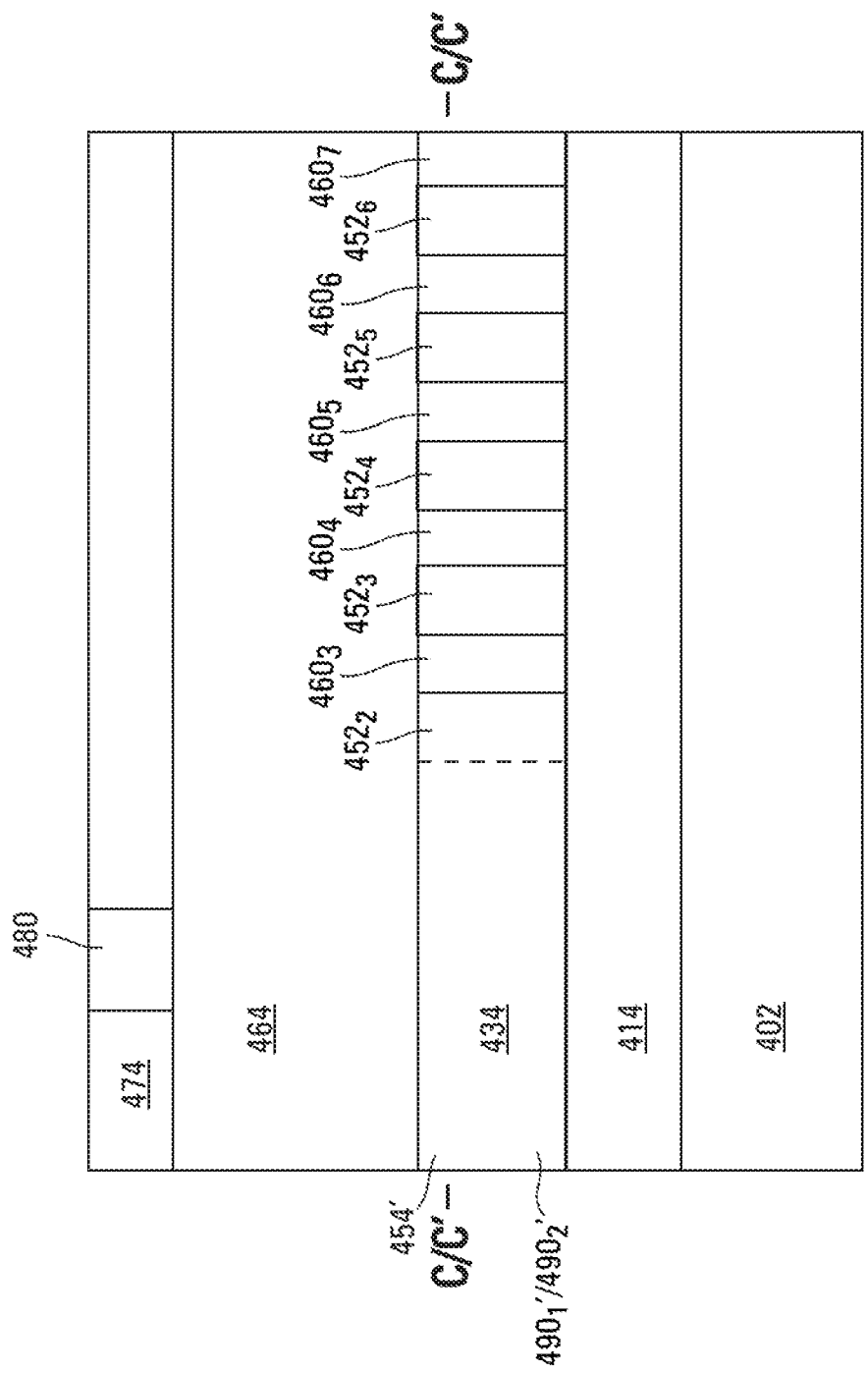

METHODS OF FORMING INTEGRATED CIRCUITS HAVING PARALLEL CONDUCTORS

RELATED APPLICATIONS

This is a continuation of U.S. patent application Ser. No. 15/973,784, filed on May 8, 2018, issued as U.S. Pat. No. 10,424,506 on Sep. 24, 2019, which is a continuation of U.S. application Ser. No. 14/887,359, filed Oct. 20, 2015, issued as U.S. Pat. No. 9,972,532 on May 15, 2018, which is a divisional of U.S. application Ser. No. 13/449,452, filed Apr. 18, 2012, issued as U.S. Pat. No. 9,177,910 on Nov. 3, 2015, which are commonly assigned and incorporated in their entirety herein by reference.

FIELD

The present disclosure relates generally to integrated circuits, and, in particular, the present disclosure relates to interconnect structures for integrated circuits and their formation, where the interconnect structures may have conductive overpasses and/or conductive underpasses.

BACKGROUND

Integrated circuits, such as memory devices, are continually being reduced in size. As a result, higher numbers of electronic components are present in a given area of integrated circuitry, resulting in a need for smaller pitched interconnect structures for physically and/or electrically connecting the integrated circuitry, e.g., to external support structures and external circuitry.

For example, internal lines, e.g., control signal lines, address signal lines, DQ signal lines, interconnect lines, etc., within memory devices, such as a dynamic random access memory (DRAM), flash memory, static random access memory (SRAM), ferroelectric (FE) memory, etc., are becoming smaller. In some applications, these internal lines may be connected to conductive pads or pins on a printed circuit board that forms a portion of a memory package.

Pitch is a quantity commonly used when addressing the spacing between neighboring features, such as adjacent conductive lines, in an integrated circuit. For example, pitch may be defined as the center-to-center distance between two adjacent lines. Lines are typically defined by spaces between adjacent lines, where the spaces may be filled by a material, such as a dielectric. As a result, pitch can be viewed as the sum of the width of a line and of the width of the space on one side of the line, separating that line from an adjacent line. However, due to factors such as optics and light or radiation wavelength, photolithography techniques each have a minimum pitch below which a particular photolithographic technique cannot reliably form lines. Thus, the minimum pitch of a photolithographic technique is an obstacle to continued line size reduction.

"Pitch multiplication," such as "pitch doubling," is commonly used for extending the capabilities of photolithographic techniques beyond their minimum pitch. The pitch is actually reduced by a certain factor during "pitch multiplication." For example, the pitch is halved during "pitch doubling."

Contacts are sometimes used to electrically and/or physically connect lines, such as pitch-multiplied conductive lines, to other lines (e.g., at other vertical levels) within the integrated circuit. For example, the other lines may connect integrated circuitry to external support structures and external circuitry.

The contacts can be larger than the pitch-multiplied conductive lines and the pitch, making it difficult to connect a contact to a pitch-multiplied conductive line without contacting an adjacent pitch-multiplied conductive line with the contact, thereby shorting the adjacent lines together. Therefore, a pitch-multiplied conductive line may be enlarged in the region where it is to be connected to a contact, e.g., so that the contact may be entirely enclosed within the region. However, the dielectric between adjacent pitch-multiplied conductive lines can break down where it wraps around the enlarged region, causing an electrical short between the adjacent pitch-multiplied conductive lines.

For the reasons stated above, and for other reasons stated below which will become apparent to those skilled in the art upon reading and understanding the present specification, there is a need in the art for alternatives for connecting contacts to conductive lines.

BRIEF DESCRIPTION OF THE DRAWINGS

FIGS. 10A-10B show a cross-section viewed along lines C-C and C'-C' in FIG. 9 during various stages of fabrication.

DETAILED DESCRIPTION

Figure 1:
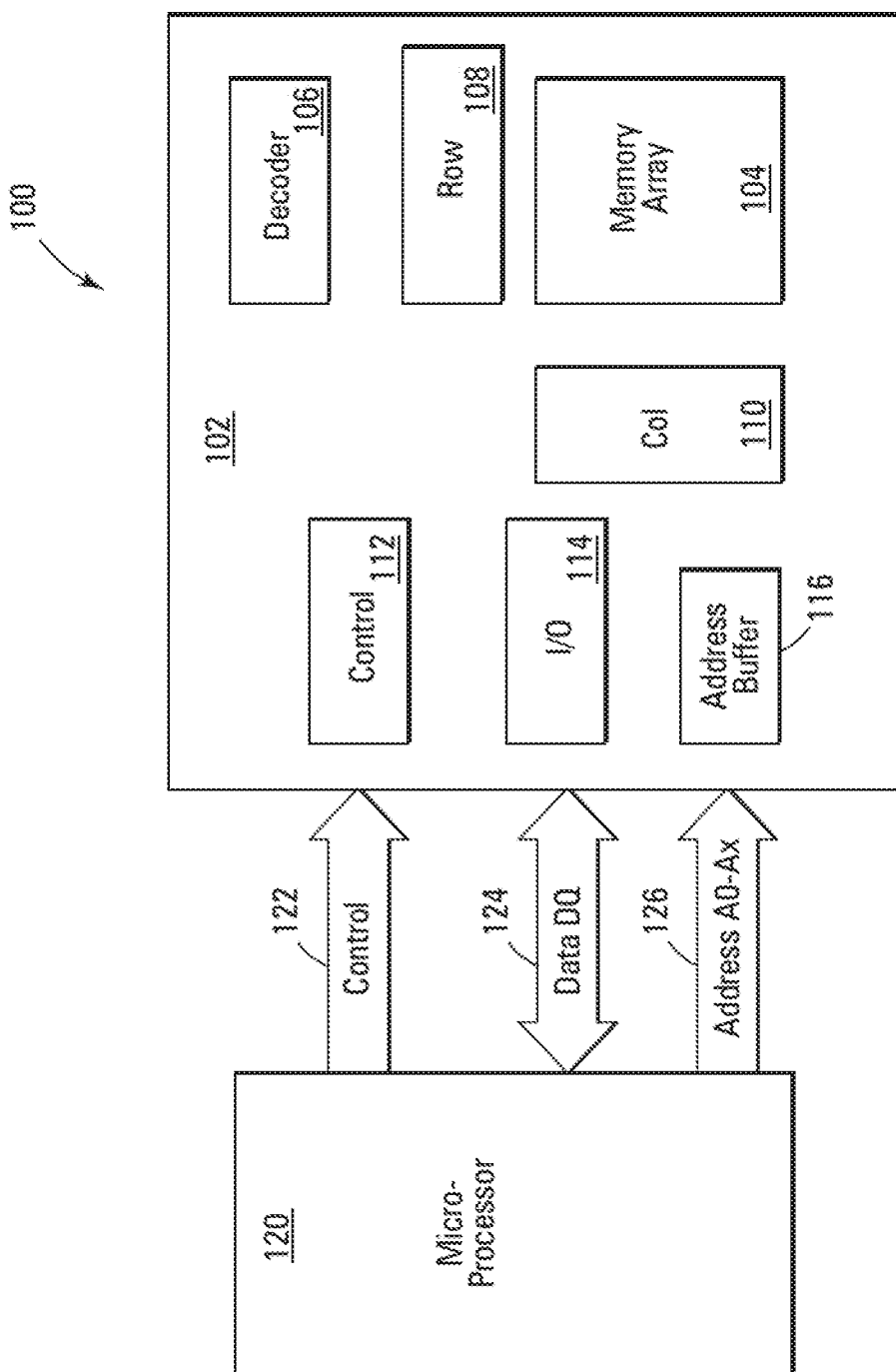
FIG. 1 is a simplified block diagram of an electronic system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term semiconductor, as used herein, can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a simplified block diagram of an electronic system, such as a memory system 100, that may include an integrated circuit device, such as an integrated circuit memory device 102. Memory device 102 may be a flash memory device (e.g., a NAND memory device), a DRAM, an SDRAM, etc., that includes an array of memory cells 104, an address decoder 106, row access circuitry 108, column access circuitry 110, control circuitry 112, input/output (I/O) circuitry 114, and an address buffer 116. Memory system 100 includes an external microprocessor 120, such as a memory controller or other external host device, coupled to memory device 102 for memory accessing as part of the electronic system.

The memory device 102 receives control signals (which represent commands) from the processor 120 over a control link 122. Memory device 102 receives data signals (which represent data) over a data (DQ) link 124. The memory cells are used to store the data. Address signals (which represent addresses) are received via an address link 126 that are decoded at address decoder 106 to access the memory array 104. Address buffer circuit 116 latches the address signals. The memory cells are accessed in response to the control signals and the address signals.

Conductors, e.g., conductive lines, such as pitch-multiplied conductors, of an interconnect structure of the integrated circuit device, e.g., memory device 102, may be laid out according to various embodiments disclosed herein. For example, the conductors may be accessed using conductive underpasses and/or conductive overpasses, e.g., so that the conductors remain substantially straight (e.g., straight). A conductive overpass or a conductive underpass might be coupled to adjacent conductors, where one of the conductors might be electrically coupled to circuitry of the integrated circuit device and where the other might be floating but for its coupling to the conductive overpass or the conductive underpass. The conductive overpass might pass over a dielectric between conductors, whereas the conductive underpass might pass under the dielectric.

It will be appreciated by those skilled in the art that additional circuitry and signals can be provided, and that the electronic system of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Figure 2:
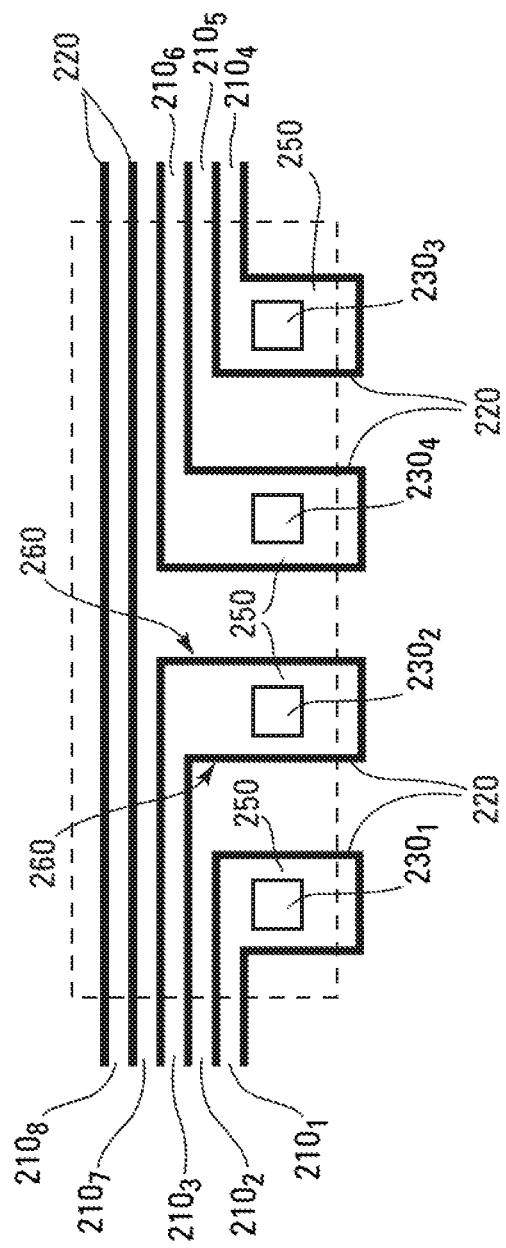
FIG. 2 is a top-down view of a layout of conductors within a portion of an integrated circuit device, according to the prior art.

FIG. 2 is a top-down view illustrating a layout of conductors, e.g., conductive lines, within a portion of an integrated circuit device, according to the prior art. The integrated circuit may include a plurality of conductors, such as conductive lines 210 (e.g., lines $210_1$ to $210_8$), e.g., that may be formed using pitch multiplication. A dielectric 220 is formed on either side of each line 210 and thus defines that line 210. For example, a dielectric 220 forms a loop around each of lines $210_1$, $210_3$, $210_4$, and $210_6$. The dielectric 220 electrically isolates a particular line 210 from adjacent lines 210.

Lines $210_1$, $210_3$, $210_4$, and $210_6$ are respectively connected to contacts $230_1$, $230_2$, $230_3$, and $230_4$ that may respectively connect lines $210_1$, $210_3$, $210_4$, and $210_6$ to lines (not shown), e.g., that may be formed on other vertical levels of the integrated circuit. Portions 250 of lines $210_1$, $210_3$, $210_4$, and $210_6$ to which contacts $230_1$, $230_2$, $230_2$, and $230_4$ are respectively connected are enlarged to have an area that is larger than contacts $230_1$, $230_2$, $230_2$, and $230_4$. This is because a width of a contact 230 may be greater than the combined width of the respective line 210 and the dielectric 220 on one or both sides of the respective line 210. Therefore, the contact 250 could short the respective line 210 to at least one of the lines adjacent to the respective line 210 if the contact is not connected to an enlarged portion 250.

Prior to forming a line 210 having an enlarged portion 250 (e.g., sometimes referred to as a "flag"), a loop of dielectric 220 may be formed around the region in which the enlarged portion 250 will be formed. For example, such a loop may include a number of corners (e.g., substantially 90-degree corners), as shown in FIG. 2. However, openings (e.g., breaks) may form in dielectric 220 when the dielectric 220 spans a relatively large distance between successive corners, as indicated by arrows 260 in FIG. 2. The conductive material used to form lines 210 may seep through these openings during the formation of lines 210 and may produce a short between adjacent lines. For example, the enlarged portion 250 of line $210_3$ may shorted to line $210_2$ and/or line $210_7$ at or near the locations indicated by arrows 260.

Figure 3:
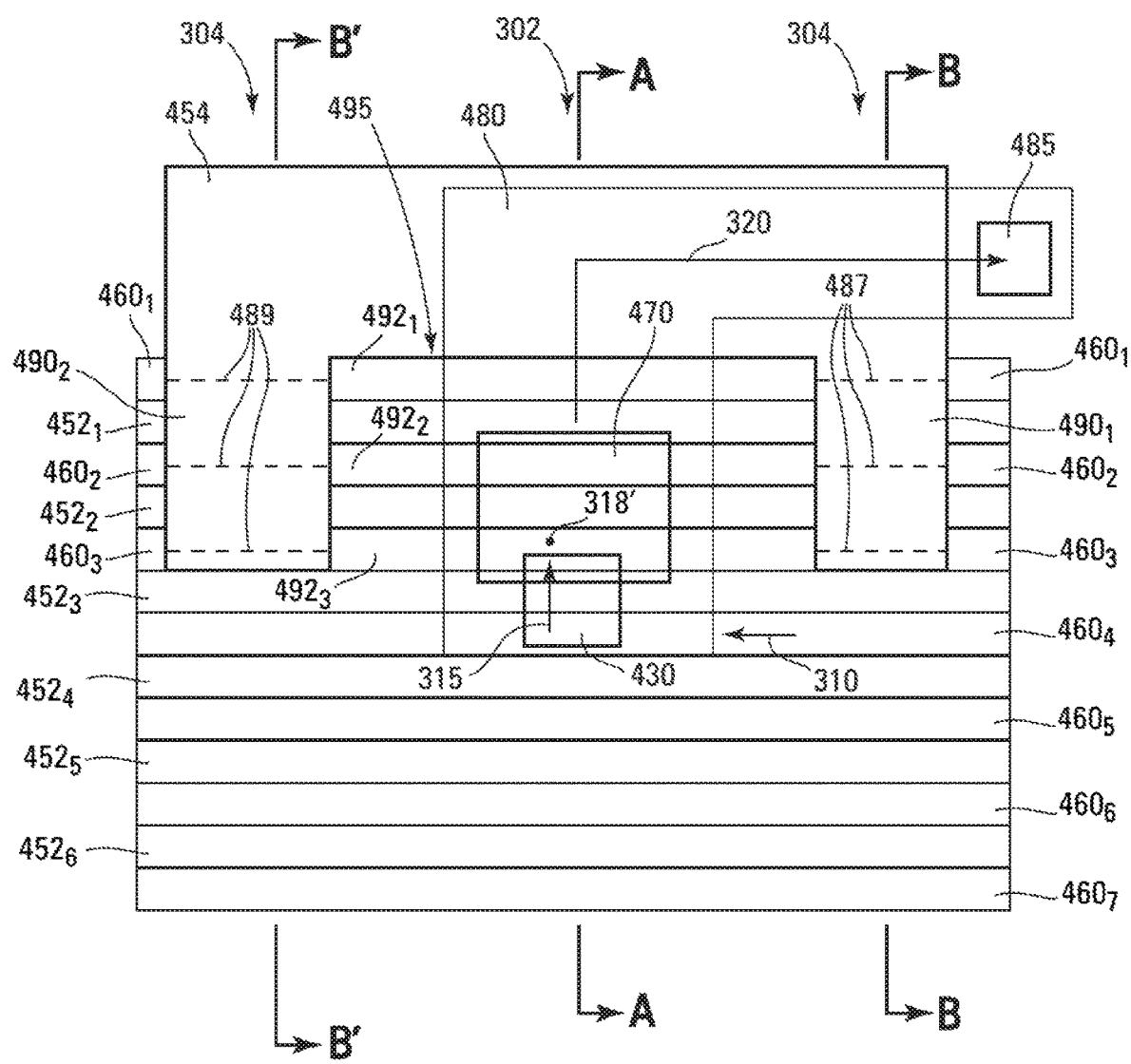
FIG. 3 is a top-down view of a layout of an interconnect structure within a portion of an integrated circuit device, according to an embodiment.

FIG. 3 is a top-down view of a circuit layout, e.g., in an interconnect structure of an integrated circuit device, such as memory device 102 of FIG. 1, including substantially straight (e.g., straight) conductors, e.g., conductive lines. For example, FIG. 3 illustrates how to access to a conductor, such as a conductive line $460_4$, using a conductive underpass (e.g., using a conductive plug 430 as an underpass) and a conductive overpass (e.g., using conductive contact 470 as an overpass), so that the conductors remain substantially straight (e.g., straight).

Conductive lines $460_4$ to $460_7$ may be electrically coupled to circuitry of the integrated circuit device. The conductive lines $460_1$ to $460_3$ to the right of a portion $490_1$ of a dielectric segment 454 and to the left of a portion $490_2$ of dielectric segment 454 may be coupled to different circuitry of the integrated circuit device. However, the conductors (e.g., conductive line segments $492_1$, $492_2$, and $492_3$) between portions $490_1$ and $490_2$ may be floating, e.g., electrically isolated. For example, conductive line segment $492_2$ may be floating but for its coupling to contact 470, and conductive line segment $492_3$ may be floating but for its coupling to plug 430 and contact 470.

FIG. 3 is intended to show where the various cross-sections discussed below are taken and how the various cross-sections relate to the overall layout of the portion of the integrated circuit device shown in FIG. 3. FIGS. 4A-4F show a cross-section viewed along line A-A in FIG. 3 during various stages of fabrication, and FIGS. 5A-5F show a cross-section viewed along each of lines B-B and B'-B' in FIG. 3 during various stages of fabrication. For example, FIGS. 4A-4F correspond to a region 302 of the integrated circuit device of FIG. 3, and FIGS. 5A-5F to each of regions 304 of the integrated circuit device of FIG. 3.

For some embodiments, the stages of fabrication shown in FIGS. 4A-4F are respectively substantially concurrent with (e.g., concurrent with) the stages of fabrication shown in FIGS. 5A-5F. The use of the term "substantially" herein accounts for routine process variations. For example, industrial processes, and thus structures produced thereby, are not exact, and minor variations may occur.

Figure 4A:
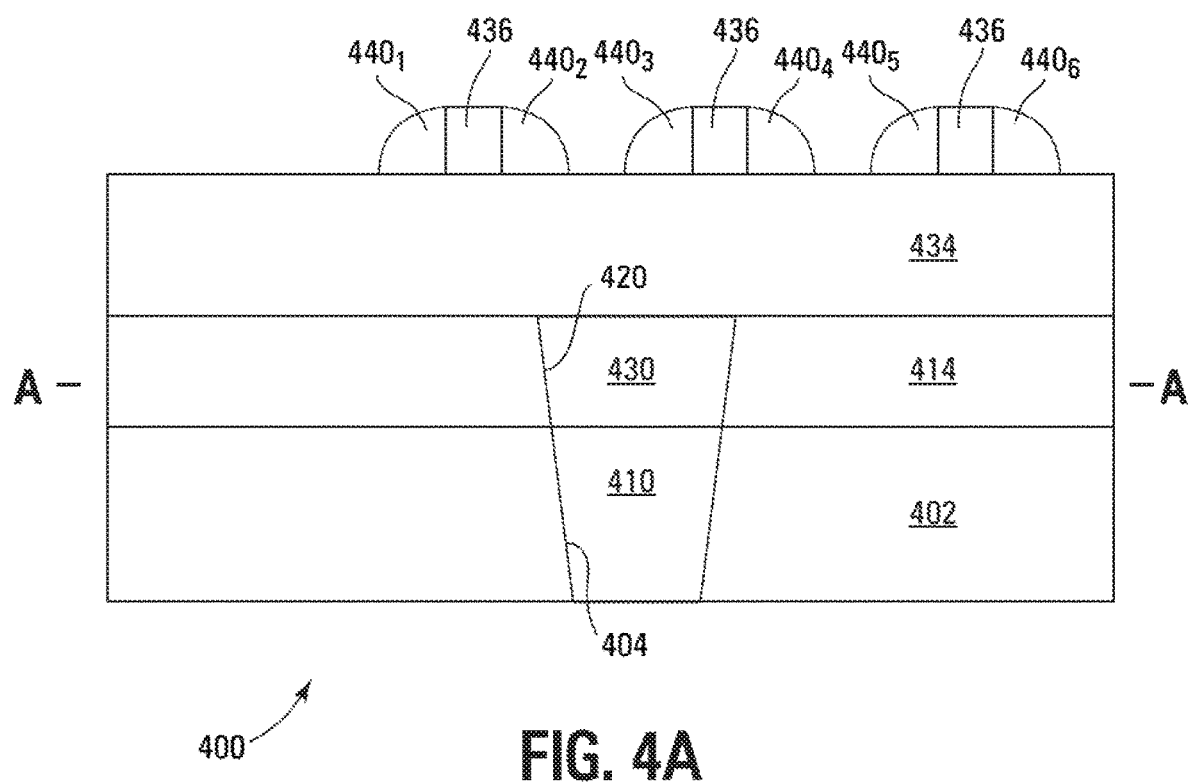
FIGS. 4A-4F show a cross-section viewed along line A-A in FIG. 3 during various stages of fabrication.
Figure 5A:
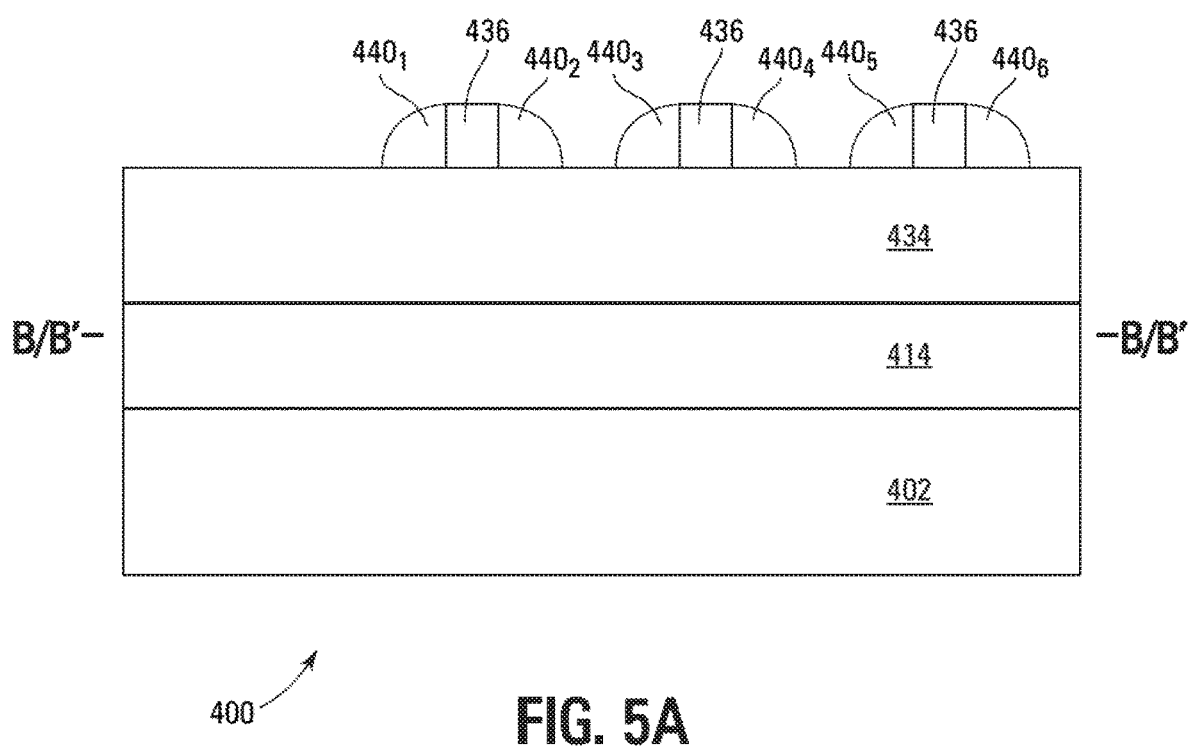
FIGS. 5A-5F show a cross-section viewed along lines B-B and B'-B' in FIG. 3 during various stages of fabrication.

In FIGS. 4A and 5A, a dielectric 402 may be formed over a semiconductor 400 that may include active regions. The semiconductor may be comprised of silicon, e.g., monocrystalline silicon, that may be conductively doped to have p-type conductivity or n-type conductivity. Alternatively, for other embodiments, dielectric 402 may be formed over another dielectric that is similar to (e.g., the same as) dielectric 402 or over wiring (e.g., a conductive line). Dielectric 402 may be generally formed of one or more dielectric materials. For example, dielectric 402 may be formed from an oxide, e.g., silicon oxide.

An opening 404 may be formed through dielectric 402, as shown in FIG. 4A, stopping on or in the semiconductor, dielectric, or wiring under dielectric 402. Opening 404 may be formed by patterning dielectric 402 and removing exposed portions of dielectric 402. For example, for some embodiments, a mask (not shown), e.g., imaging resist, such as photoresist, may be formed over dielectric 402 and patterned to define a region of dielectric 402 for removal. The region defined for removal is subsequently removed, e.g., by etching, to form opening 404. For some embodiments, opening 404 may expose an active area in the semiconductor.

A conductive plug 410 may be formed in opening 404 from a conductor, as shown in FIG. 4A, e.g., so that conductive plug 410 may be coupled to an active region or the wiring under dielectric 402, e.g., conductive plug 410 may be in direct physical contact with the active region or the wiring. For example, the conductor may be deposited in opening 404 and possibly over dielectric 402, such as by blanket deposition. The conductor 408 may then be removed from dielectric 402, e.g., by chemical mechanical planarization (CMP), thereby forming conductive plug 410.

The conductor from which conductive plug 410 is formed may be generally formed of one or more conductive materials. For example, the conductor from which conductive plug 410 is formed may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material.

A dielectric 414 may then be formed over dielectric 402 and conductive plug 410, as shown in FIGS. 4A and 5A. Dielectric 414 may be generally formed of one or more dielectric materials. For example, dielectric 414 may be formed from an oxide, e.g., silicon oxide.

An opening 420 may then be formed through dielectric 414, stopping at or in conductive plug 410, thereby exposing conductive plug 410, as shown in FIG. 4A. That is, opening 420 may be aligned (e.g., vertically aligned) with conductive plug 410.

Opening 420 may be formed by patterning dielectric 414 and removing exposed portions of dielectric 414. For example, for some embodiments, a mask (not shown), e.g., imaging resist, such as photoresist, may be formed over dielectric 414 and patterned to define a region of dielectric 414 for removal. The region defined for removal is subsequently removed, e.g., by etching, to form opening 420.

A conductive underpass (e.g. a conductive plug 430) may be formed in opening 420 from a conductor, as shown in FIG. 4A, so that the conductive underpass may be coupled to conductive plug 410, e.g., the conductive underpass may be in direct physical contact with conductive plug 410. For example, the conductor may be deposited in opening 420 and possibly over dielectric 414, such as by blanket deposition. The conductor may then be removed from dielectric 414, e.g., by CMP, thereby forming conductive plug 430.

The conductor from which conductive plug 430 is formed may be generally formed of one or more conductive materials. For example, the conductor from which conductive plug 430 is formed may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material. Where no electrical connection is desired below conductive plug 430, conductive plug 410 may be eliminated such that conductive plug 430 is formed on dielectric 402. Alternatively, conductive plug 430 could provide the connection to an underlying active area or wiring without the formation of conductive plug 410.

A dielectric 434 may then be formed over dielectric 414 and conductive plug 430, as shown in FIGS. 4A and 5A. Dielectric 434 may be generally formed of one or more dielectric materials. For example, dielectric 434 may be formed from an oxide, e.g., silicon oxide.

Mask segments 436 may be formed on dielectric 434, as shown in FIGS. 4A and 5A. For example, mask segments 436 may be formed from a mask layer, such as a photoresist layer, that is formed over dielectric 434 and that is patterned to form mask segments 436.

Spacers 440 (e.g., spacers $440_1$ to $440_6$) may then be formed on sidewalls of mask segments 436. For example, spacers 440 may be formed from a dielectric, e.g., silicon nitride, silicon oxide, etc., that is formed over mask segments 436 and dielectric 434, e.g., using a blanket deposition. Portions of the dielectric may then be anisotropically removed so that remaining portions of the dielectric self-align with and form spacers 440 on sidewalls of mask segments 436, as shown in FIGS. 4A and 5A. For one embodiment, this may be accomplished using an anisotropic etching process that selectively removes horizontal portions of the dielectric, thus leaving spacers 440 on the sidewalls of mask segments 436.

Figure 4B:
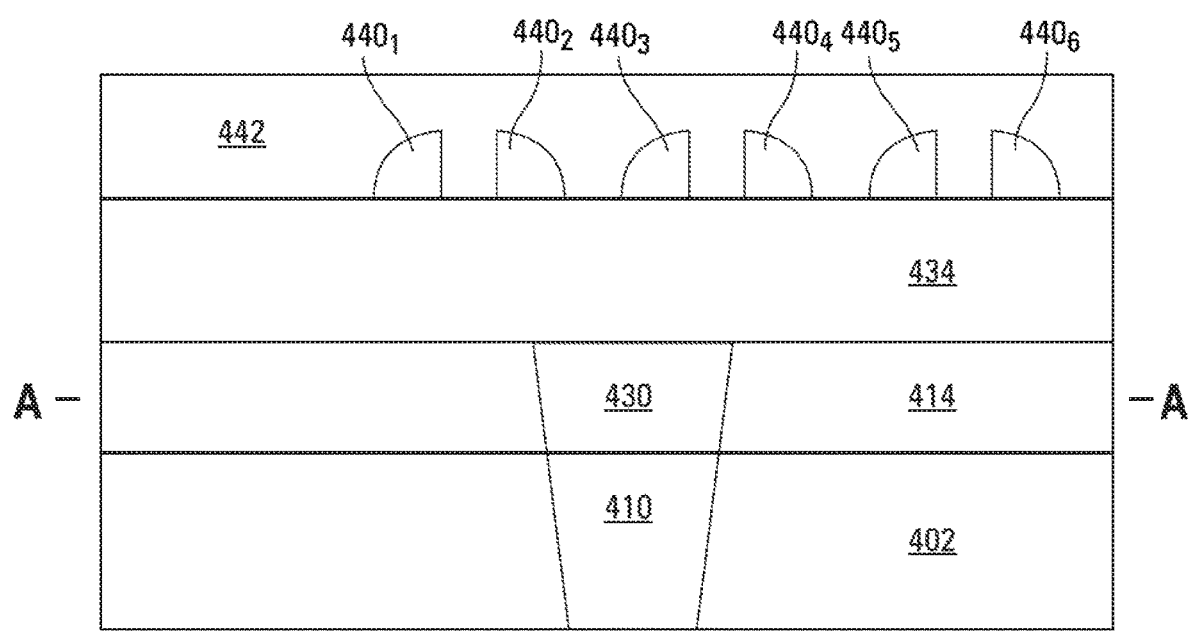
Figure 5B:
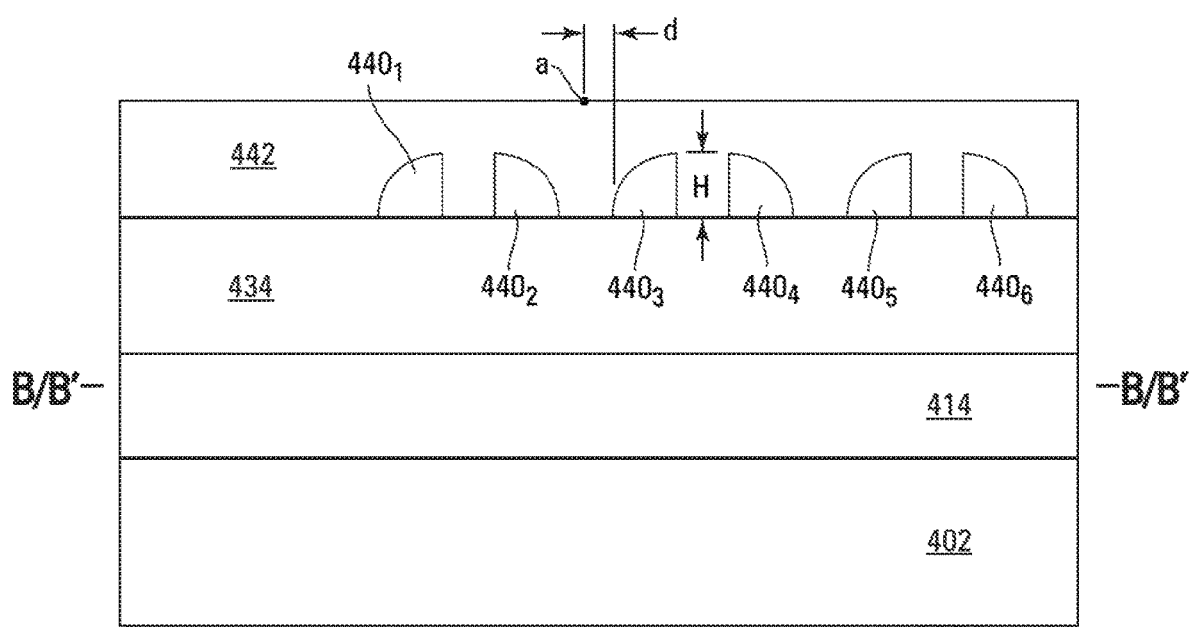

Mask segments 436 are removed substantially concurrently (e.g., concurrently) in FIGS. 4B and 5B, e.g., using an etch selective to mask segments 436, stopping, for example, at an upper surface of dielectric 434 and leaving spacers $440_1$ to $440_6$. Note that spacers $440_1$ to $440_6$ in FIG. 4B are respectively contiguous with spacers $440_1$ to $440_6$ in FIG. 5B. In other words, spacers $440_1$ to $440_6$ may be continuous structures that may extend perpendicularly into the face plane of FIG. 4B to the face plane of FIG. 5B.

A mask (e.g., photoresist) 442, is formed over dielectric 434 and spacers 440, as shown in FIGS. 4B and 5B. Mask 442 is then patterned so that mask 442 is removed, in FIG. 4C (e.g., in region 302 of FIG. 3), from all of spacers $440_1$ to $440_6$, and from the space $446_1$ between successively adjacent spacers $440_1$ and $440_2$, the space $446_2$ between successively adjacent spacers $440_2$ and $440_3$, the space $446_3$ between successively adjacent spacers $440_3$ and $440_4$, the space $446_4$ between successively adjacent spacers $440_4$ and $440_5$, the space $446_5$ between successively adjacent spacers $440_5$ and $440_6$, and the space $446_6$ to the right of spacer $440_6$.

Figure 4C:
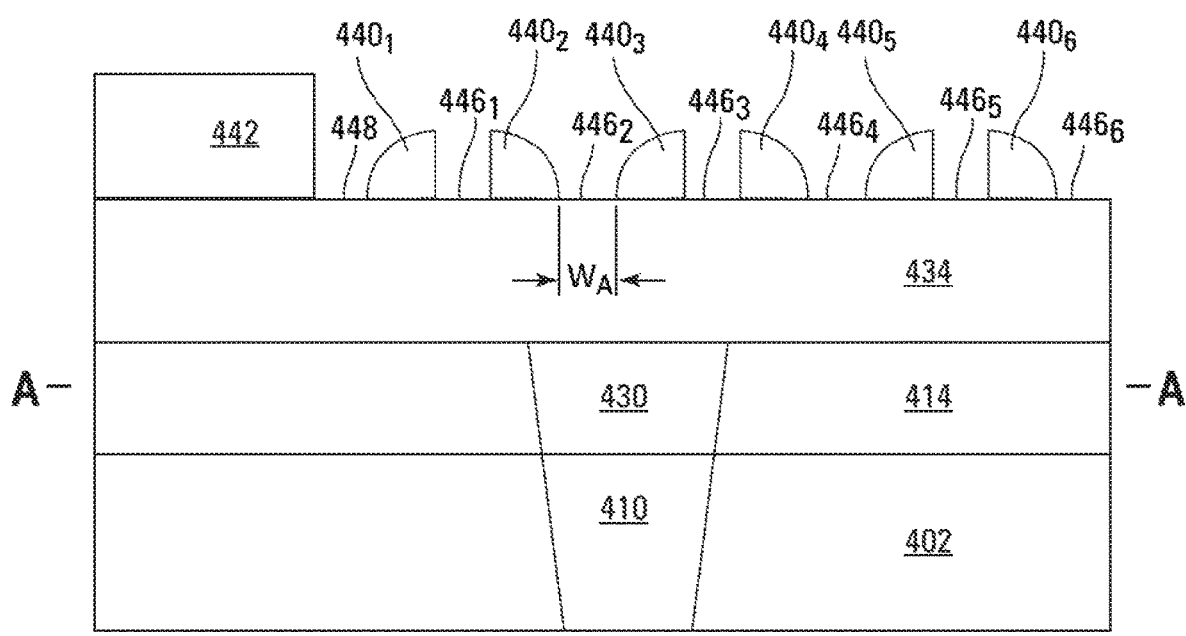

Mask 442 is removed so that there is a space 448 between spacer $440_1$ and mask 442, as shown in FIG. 4C.

Figure 5C:
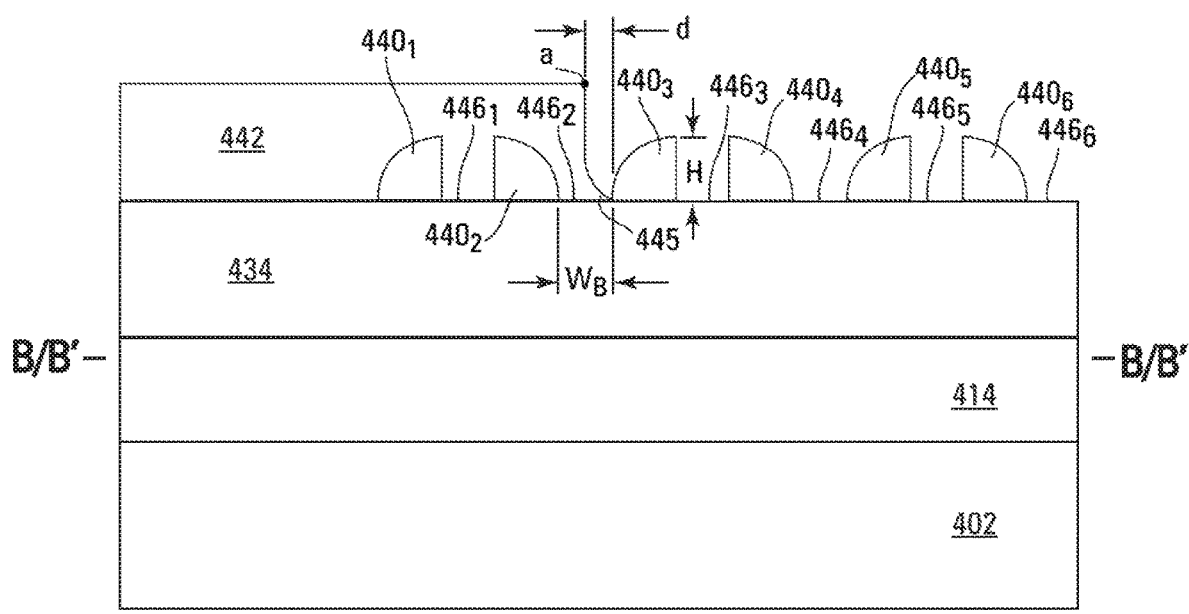

Substantially concurrently with (e.g., concurrently with) the removal of mask 442 in FIG. 4C, in FIG. 5C (e.g., in regions 304 of FIG. 3), mask 442 is removed from spacers $440_3$ to $440_6$ and from the space $446_3$ between successively adjacent spacers $440_3$ and $440_4$, the space $446_4$ between successively adjacent spacers $440_4$ and $440_5$, the space $446_5$ between successively adjacent spacers $440_5$ and $440_6$ and the space $446_6$ to the right of spacer $440_6$. However, mask 442 remains over and covers the portions of successively adjacent spacers $440_1$ and $440_2$ in FIG. 5C, the portion of the space $446_1$ between the covered portions of successively adjacent spacers $440_1$ and $440_2$ in FIG. 5C, and the portion of the space $446_2$ between the covered portion of spacer $440_2$ and the successively adjacent uncovered spacer $440_3$ in FIG. 5C.

For example, in embodiments where mask 442 is positive photoresist, the portions of mask 442 to be removed may be exposed to electromagnetic radiation and subsequently removed upon application of a developer solution, while the portions of mask 442 that are not to be removed are not exposed to the electromagnetic radiation, and are thus not removed by the developer solution. Conversely, in embodiments where mask 442 is negative photoresist, the portions of mask 442 that are not to be removed may be exposed to electromagnetic radiation, while the portions of mask 442 that are to be removed are not exposed to the electromagnetic radiation and are subsequently removed upon application of a developer solution.

For embodiments where mask 442 is positive photoresist, the region to the right of location a, and, for example, including the location a, in FIG. 5B might be exposed to electromagnetic radiation, whereas the region to the left of location a might not be exposed to the electromagnetic radiation, where location a might be at a lateral distance d (e.g., that may have a value of up to about 16 nanometers) from a sidewall of spacer $440_3$ and might be between successively adjacent spacers $440_2$ and $440_3$. For embodiments where mask 442 is negative photoresist, the region to the left of location a, and, for example, including the location a, in FIG. 5B might be exposed to electromagnetic radiation, whereas the region to the right of location a might not be exposed to the electromagnetic radiation.

Subsequently, a developer solution may be applied to mask 442. However, for certain aspect ratios (e.g., H/d, where H is the height of spacer $440_3$), the developer solution might not penetrate all the way to the upper surface of dielectric 434, as shown in FIG. 5C, e.g., in the region between the upper surface of spacer $440_3$ and the upper surface of dielectric 434 within space $446_2$. As such, a portion 445 of mask 442 may remain between location a and the sidewall of spacer $440_3$ in the region between the upper surface of spacer $440_3$ and the upper surface of dielectric 434. For example, this phenomenon may be referred to as "scumming."

For example, in FIG. 5C mask 442 may be said to be "scummed" to spacer $440_3$. The "scumming" technique used herein may be referred to as a self-alignment technique, in that mask 442 self-aligns to the sidewall of spacer $440_3$. In other words, mask 442 may be contiguous with (e.g., may abut) the sidewall of spacer $440_3$.

Note that portion 445 is in condition for removal by the developer solution, but is not removed by the developer solution, in that the aspect ratio is such that developer solution cannot sufficiently reach portion 445 to effect full removal. That is, portion 445 exposed to electromagnetic radiation when mask 442 is positive photoresist and is not exposed to radiation when mask 442 is negative photoresist.

"Scumming" is usually undesirable, in that it is usually desired to remove all of the unhardened mask material. However, for some embodiments herein, "scumming" is used advantageously to leave portion 445 of mask 442 between location a and the sidewall of spacer $440_3$ so that portion 445 protects the portion of dielectric 434 thereunder from removal in a subsequent removal process. That is, portion 445 may fill in the remainder of space $446_2$ between spacers $440_2$ and $440_3$ and may contiguous with, e.g., may abut, spacer $440_3$.

Figure 6A:
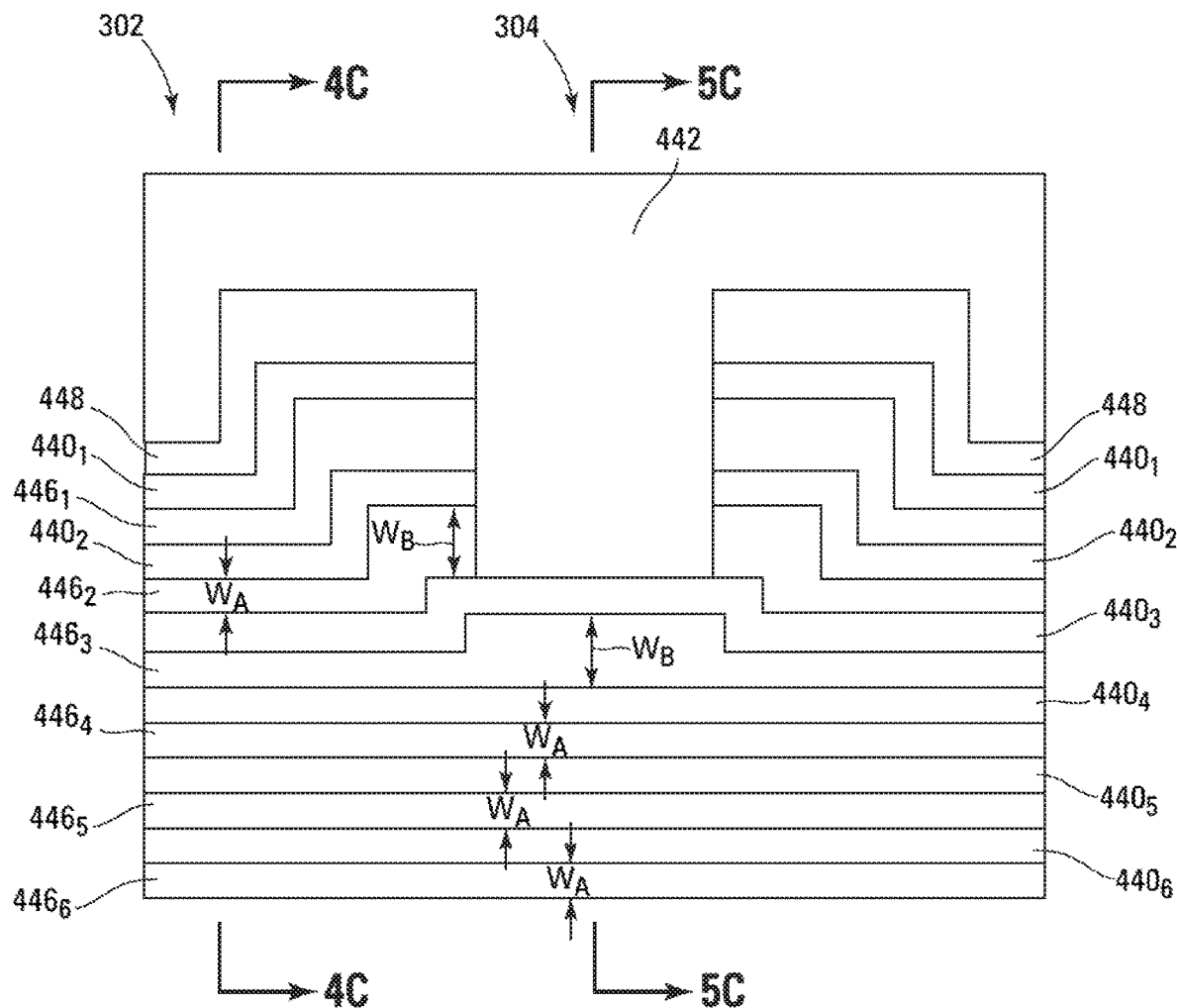
FIG. 6A is a top view of FIGS. 4C and 5C, according to another embodiment.

For some embodiments, the distance between successively adjacent spacers $440_1$ and $440_2$, between successively adjacent spacers $440_2$ and $440_3$, and between successively adjacent spacers $440_3$ and $440_4$ (e.g., the width $W_B$ of spaces $446_1$, $446_2$, and $446_3$) in regions 304 of the integrated circuit device corresponding to FIG. 5C may be greater than the distance between successively adjacent spacers $440_1$ and $440_2$, between successively adjacent spacers $440_2$ and $440_3$, and between successively adjacent spacers $440_3$ and $440_4$ (e.g., the width $W_A$ of spaces $446_1$, $446_2$, and $446_3$) in the region 302 of the integrated circuit device corresponding to FIG. 4C. This is also shown in FIG. 6A a top view of FIGS. 4C and 5C, according to some embodiments, where FIG. 4C is a cross-section viewed along line 4C-4C in FIG. 6A, and FIG. 5C is a cross-section viewed along line 5C-5C in FIG. 6A. In other words, there may be a bulge in the portion of spaces $446_1$ and $446_2$ left under a portion of mask 442 and a bulge in the portion of space $446_3$ that is successively adjacent to the spacer $440_3$ that is contiguous with (e.g., self-aligned to) that portion of mask 442. Note that conductive lines may be ultimately formed in the portions of dielectric 434 corresponding to space 448 and spaces $446_1$ to $446_6$, and the conductive lines may have bulges where spaces $446_1$, $446_2$, and $446_3$ are bulged.

The greater distance $W_B$ between successively adjacent spacers 440 in region 304 (FIG. 6A) can facilitate the "scumming" process by reducing the likelihood of a portion of mask 442 remaining in the space $446_3$ between successively adjacent spacers $440_3$ and $440_4$. That is, the greater distance $W_B$ between successively adjacent spacers 440 in region 304 can reduce the likelihood of mask 442 accidentally "scumming" to spacer $440_4$. Note, however, that the distance between successively adjacent spacers $440_4$ and $440_5$ and between successively adjacent spacers $440_5$ and $440_6$ (e.g., the width $W_A$ of spaces $446_4$, $446_5$, and $446_6$) in regions 302 and 304 may be substantially the same, as shown in FIG. 6A.

Figure 4D:
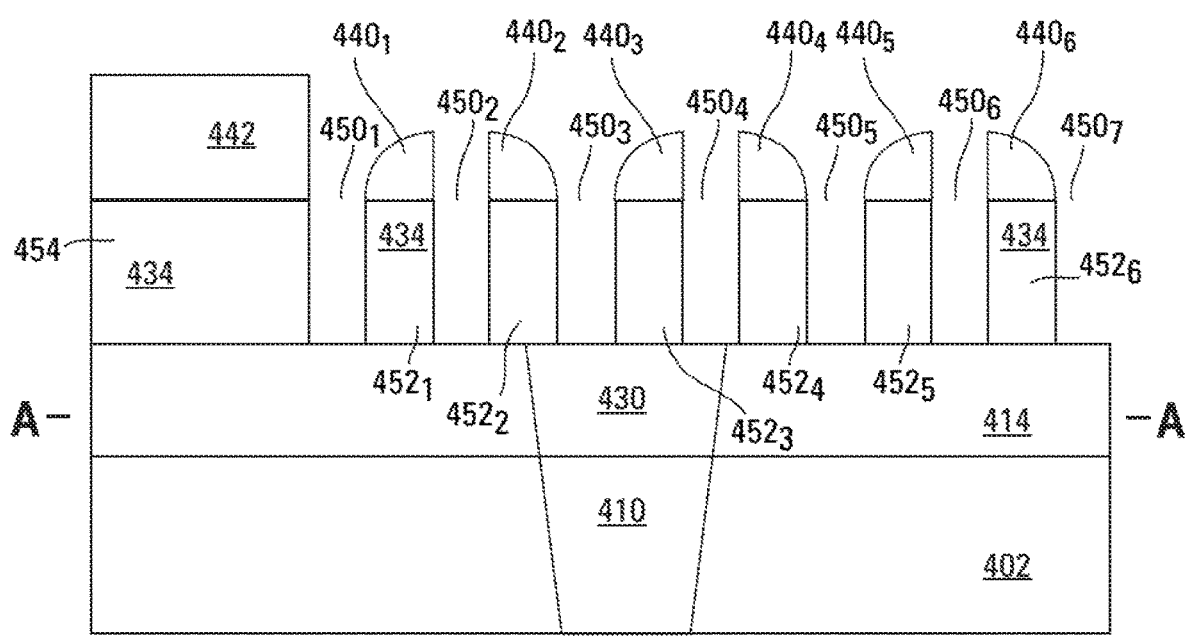

Spacers 440 and mask 442 form a pattern for respectively exposing portions of dielectric 434 for removal. The exposed portions of dielectric 434, corresponding to spaces $446_1$ to $446_6$ and space 448 in FIG. 4C, are removed in FIG. 4D, stopping at or in dielectric 414 and conductive plug 430. This forms opening $450_1$ in dielectric 434, corresponding to the space 448, and openings $450_2$ to $450_7$, respectively corresponding to the spaces $446_1$ to $446_6$, as shown in FIG. 4D. Note that openings $450_3$ and $450_4$ expose respective portions of conductive plug 430.

Figure 5D:
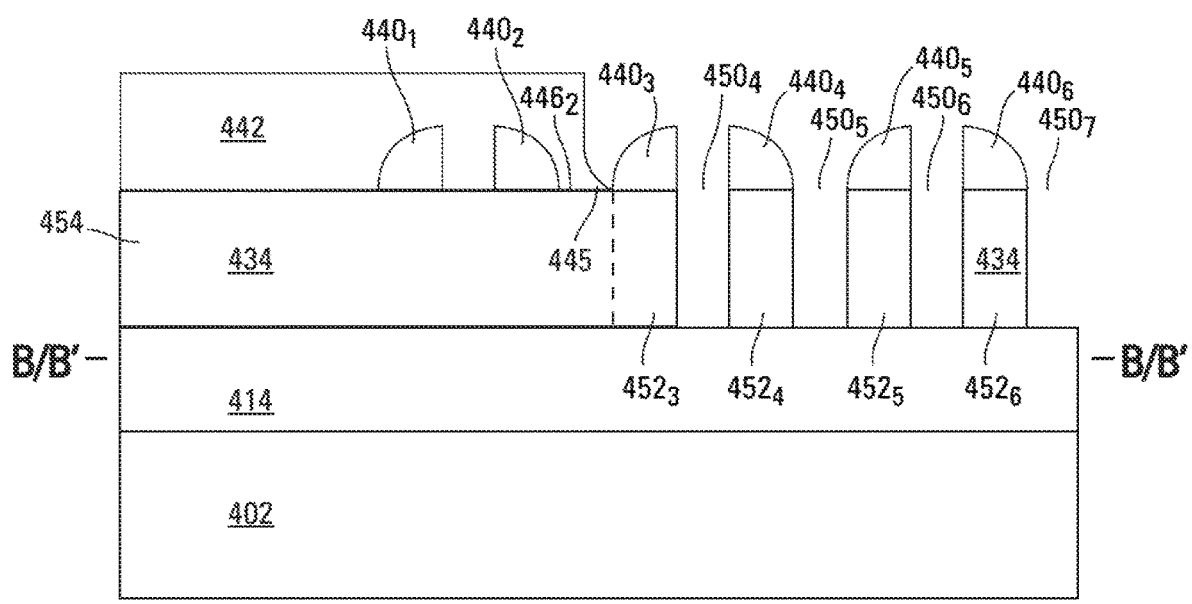

The exposed portions of dielectric 434, corresponding to spaces $446_3$ to $446_6$ in FIG. 5C, are removed in FIG. 5D, stopping at or in dielectric 414. This forms openings $450_4$ to $450_7$, respectively corresponding to the spaces $446_3$ to $446_6$, as shown in FIG. 5D. The removal of exposed portions of dielectric 434 in FIGS. 4D and 5D may occur substantially concurrently (e.g., concurrently) for some embodiments. For some embodiments, an anisotropic dry etch, e.g., a reactive ion etch, accomplishes the removal of the exposed portions of dielectric 434.

The portions of dielectric 434 remaining under and corresponding to respective spacers 440 and the portion of dielectric 434 remaining under and corresponding to mask 442 may be referred to segments of dielectric 434. For example, the segments of dielectric 434 remaining under and corresponding to spacers $440_1$ to $440_6$ may be respectively referred to as dielectric segments $452_1$ to $452_6$, and the segment of dielectric 434 remaining under and corresponding to mask 442 may be referred to as dielectric segment 454, as shown in FIGS. 4D and 5D. Note that dielectric segment 454 may be contiguous with (e.g., may abut) dielectric segment $452_3$ in FIG. 5D.

For some embodiments, after forming the openings $450_1$ to $450_7$, mask 452 may be removed from dielectric segment 454, e.g., by ashing, and spacers 440 may be removed from dielectric segments 452, e.g., by CMP. Conductive lines $460_1$ to $460_7$ may then be respectively formed in openings $450_1$ to $450_7$, as shown in FIGS. 4E and 5E.

For example, conductive lines $460_1$ to $460_7$ may be formed from a conductor that may be deposited in each of openings $450_1$ to $450_7$ and possibly over dielectric 434, such as by blanket deposition. The conductor may then be removed from dielectric 434, e.g., CMP.

Figure 4E:
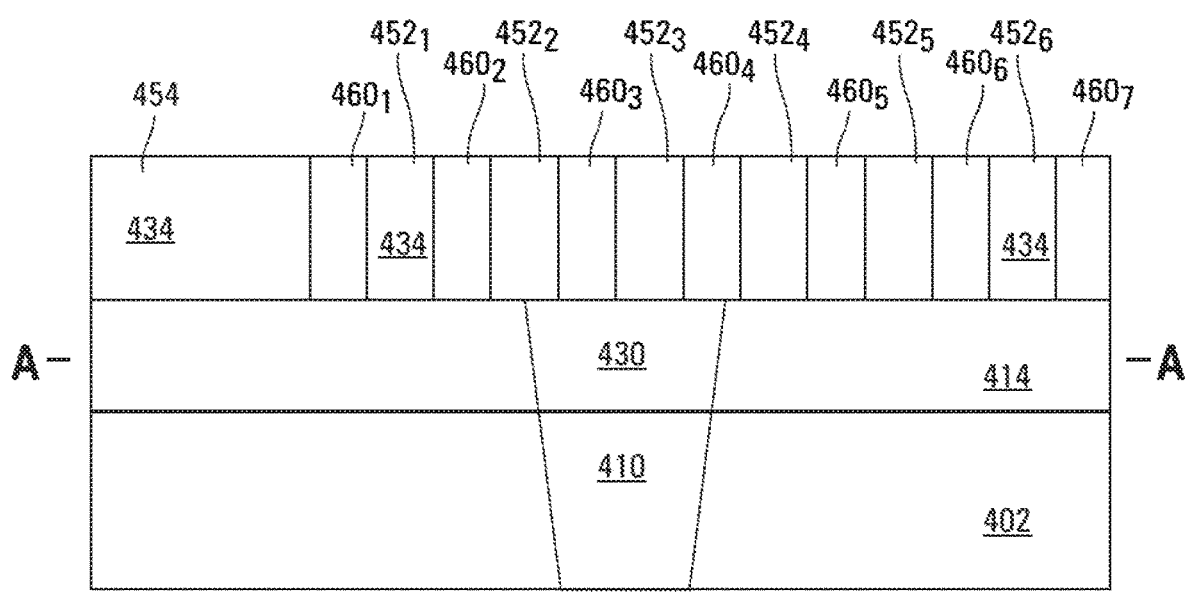
Figure 5E:
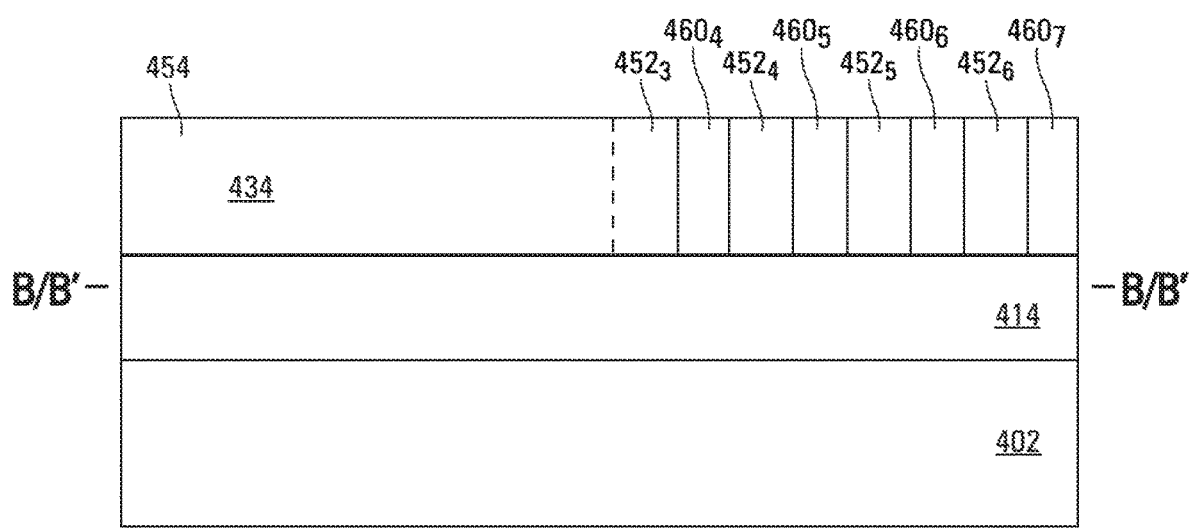

At least portions of conductive lines $460_3$ and $460_4$ may be coupled to, e.g., by direct physical contact with, conductive plug 430, as shown in FIG. 4E. For example, the lower (e.g., bottom) surfaces of conductive lines $460_3$ and $460_4$ may be coupled to (e.g., in direct contact with) conductive plug 430. The technique for forming conductive lines 460 using spacers 440 may be referred to pitch multiplication (e.g., pitch doubling), and lines 460 may be referred to as pitch-multiplied (e.g., pitch-doubled) lines.

Figure 4F:
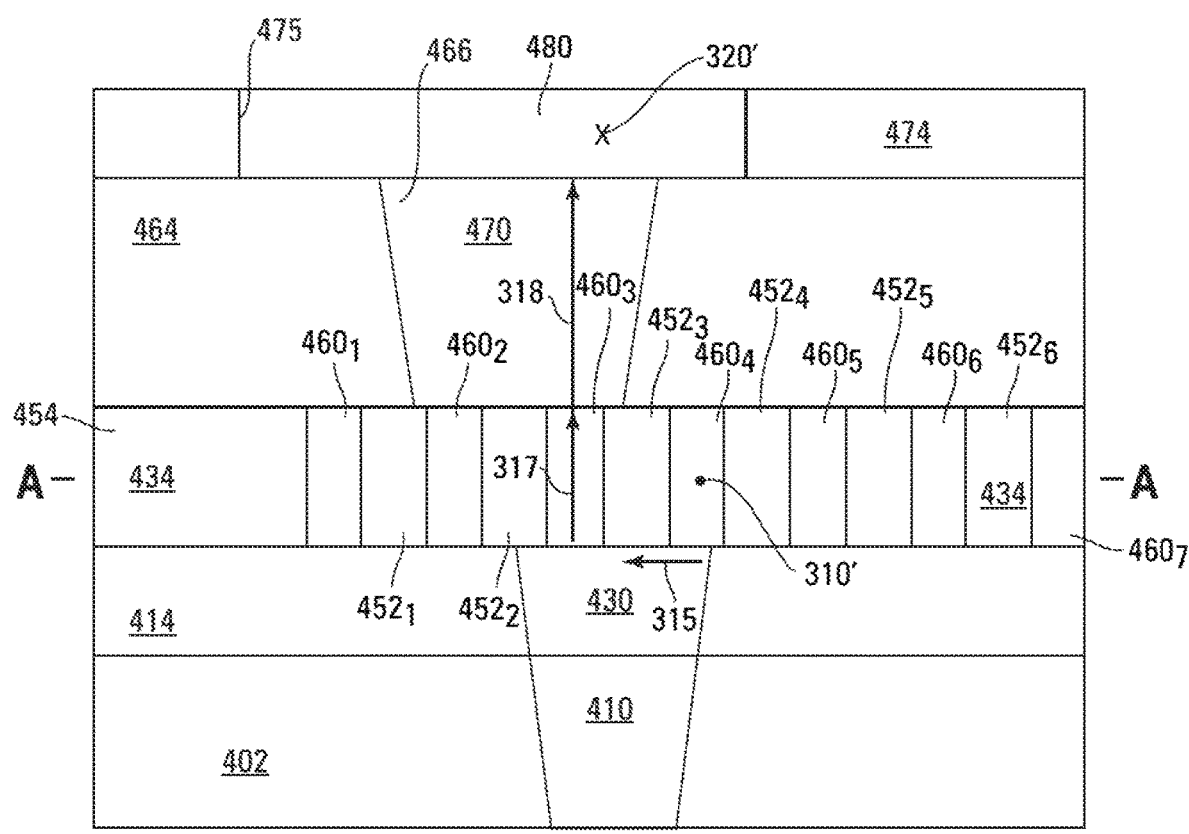
Figure 5F:
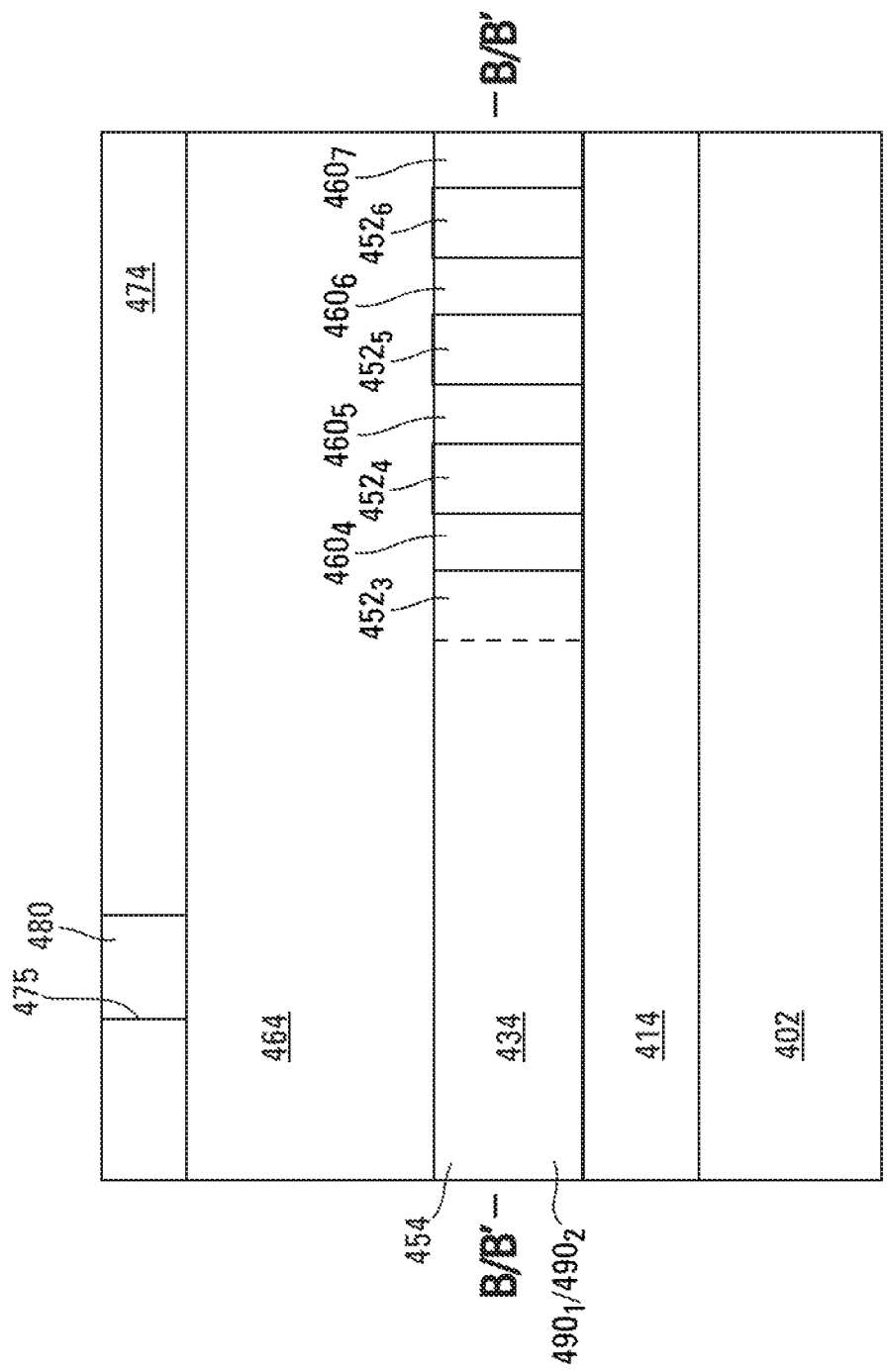

Dielectric segments 452 may be between successively adjacent conductive lines 460, e.g., dielectric segment $452_1$ between successively adjacent conductive lines $460_1$ and $460_2$, dielectric segment $452_2$ between successively adjacent conductive lines $460_2$ and $460_3$, dielectric segment $452_3$ between successively adjacent conductive lines $460_3$ and $460_4$, dielectric segment $452_4$ between successively adjacent conductive lines $460_4$ and $460_5$, dielectric segment $452_5$ between successively adjacent conductive lines $460_5$ and $460_6$, and dielectric segment $452_6$ between successively adjacent conductive lines $460_6$ and $460_7$, as shown in FIGS. 4F, 5F, and 3.

The conductor from which conductive lines 460 may be formed may be generally formed of one or more conductive materials. For example, the conductor may comprise, consist of, or consist essentially of a metal or metal-containing layer and may be aluminum, copper, a refractory metal, or a refractory metal silicide layer. In some embodiments, the conductor may contain multiple metal-containing layers, e.g., a titanium nitride (TiN) barrier layer, a titanium (Ti) adhesion layer formed over the barrier layer, and a tungsten (W) layer formed over the adhesion layer.

Figure 6B:
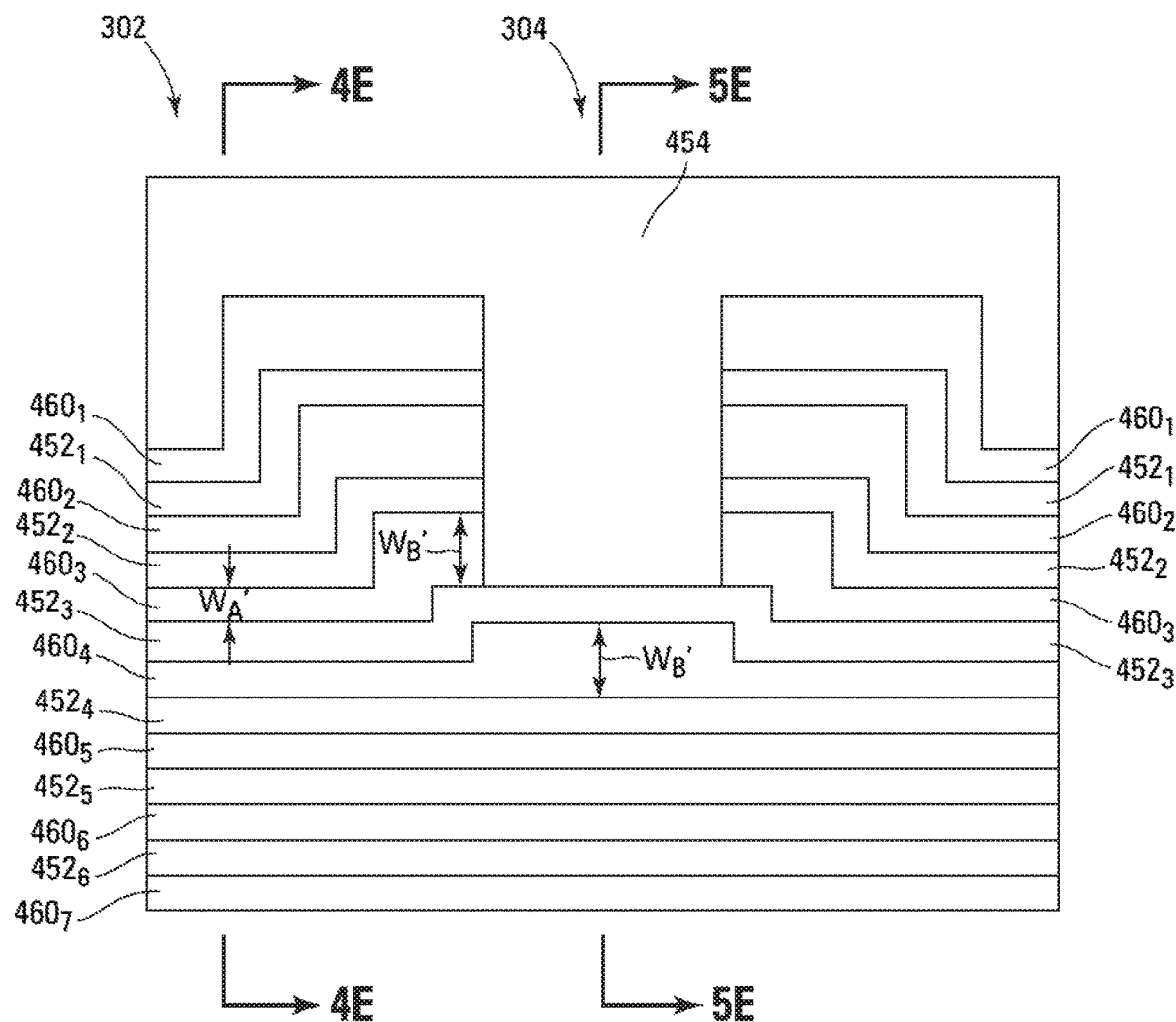
FIG. 6B is a top view of FIGS. 4E and 5E, according to another embodiment.

FIG. 6B is a top view of FIGS. 4E and 5E, corresponding to the embodiment shown in FIG. 6A, where FIG. 4E is a cross-section viewed along line 4E-4E in FIG. 6B, and FIG. 5E is a cross-section viewed along line 5E-5E in FIG. 6B. Note that the portions of lines $460_2$ and $460_3$ intersected (e.g., broken) by dielectric segment 454 may have bulges. That is, the portions of lines $460_2$ and $460_3$ in region 304 intersected by dielectric segment 454 may have a greater width $W_B'$ (e.g., distance between successive dielectric segments 452) in region 304 than the width $W_A'$ (e.g., distance between successive dielectric segments 452) of the portions of lines $460_2$ and $460_3$ in region 302, e.g., where contact 470 may be formed (FIG. 3). In addition, the portion of line $460_4$ in region 304, corresponding to where a portion of dielectric segment $452_3$ (e.g., that bounds that portion of line $460_4$) is contiguous with dielectric segment 454, is also bulged, e.g., may have a greater width $W_B'$ than the width $W_A'$ of the portions of line $460_4$ where contact 470 might be formed (FIG. 3). As indicated above in conjunction with FIG. 6A, the bulges are the result of the extra separation distance between successively adjacent spacers in order to facilitate the "scumming" process.

A dielectric 464 may then be formed over conductive lines $460_1$ to $460_7$ and dielectric 434, e.g., dielectric segments 452 and 454, in FIGS. 4F and 5F, e.g., substantially concurrently (e.g., concurrently). An opening 466 may then be formed in dielectric 464 in FIG. 4F, stopping at or in conductive lines $460_2$ and $460_3$ and at least the dielectric segment $452_2$ between conductive lines $460_2$ and $460_3$. Dielectric 464 may be generally formed of one or more dielectric materials. For example, dielectric 464 may be formed from an oxide, e.g., silicon oxide.

A conductive overpass (e.g., a conductive contact 470) may be formed in opening 466 in FIG. 4F from a conductor so that the conductive overpass may be coupled to conductive lines $460_2$ and $460_3$, e.g., at their upper surfaces, and at least dielectric segment $452_2$, e.g., so that the conductive overpass may be in direct physical contact with the upper (e.g., top) surfaces of conductive lines $460_2$ and $460_3$ and at least dielectric segment $452_2$. For example, the conductor may be deposited in opening 466 and possibly over dielectric 464, such as by blanket deposition. The conductor may then be removed from dielectric 464, e.g., by CMP, thereby forming conductive contact 470.

The conductor from which contact 470 may be formed may be generally formed of one or more conductive materials. For example, the conductor from which contact 470 may be formed may comprise, consist of, or consist essentially of a metal or metal-containing layer and may be aluminum, copper, a refractory metal, or a refractory metal silicide layer. In some embodiments, the conductor from which contact 470 may be formed may contain multiple metal-containing layers, e.g., a titanium nitride (TiN) barrier layer, a titanium (Ti) adhesion layer formed over the barrier layer, and a tungsten (W) layer formed over the adhesion layer. For other embodiments, the conductor from which contact 470 may be formed may comprise, consist of, or consist essentially of conductively doped polysilicon.

A dielectric 474 may then be formed over dielectric 464 and contact 470 in FIG. 4F and over dielectric 464 in FIG. 5F, e.g., substantially concurrently (e.g., concurrently). An opening 475 may then be formed in dielectric 474 in FIGS. 4F and 5F. Opening 475 may stop at or in dielectric 464 and contact 470 in FIG. 4F and at or in dielectric 464 in FIG. 5F. Dielectric 474 may be generally formed of one or more dielectric materials. For example, dielectric 474 may be formed from an oxide, e.g., silicon oxide.

A conductive line 480 may be formed in opening 475 in FIGS. 4F and 5F from a conductor, e.g., substantially concurrently (e.g., concurrently), so that conductive line 480 may be coupled to contact 470, e.g., so that conductive line 480 may be in direct physical contact with contact 470. For example, the conductor may be deposited in opening 475 and possibly over dielectric 474, such as by blanket deposition. The conductor may then be removed from dielectric 474, e.g., by CMP, thereby forming conductive line 480.

The conductor from which conductive line 480 may be formed may be generally formed of one or more conductive materials. For example, the conductor from which conductive line 480 may be formed may comprise, consist of, or consist essentially of a metal or metal-containing layer and may be aluminum, copper, a refractory metal, or a refractory metal silicide layer.

FIG. 3 shows that conductive line $460_4$ is coupled to line 480, and thus a conductive pad 485, by conductive plug 430 and contact 470. Portions $490_1$ and $490_2$ of dielectric segment 454 may respectively form discontinuities (e.g., breaks) 487 and 489 in conductive lines $460_1$, $460_2$, and $460_3$, as shown in FIG. 3. Portions $490_1$ and $490_2$ may be contiguous with a side of dielectric segment $452_3$, as shown in FIG. 3 and in FIG. 5F. Note that dielectric segment 454 corresponds to mask 442 in FIG. 5D and that the formation of discontinuities 487 and 489 is facilitated by the self-alignment (e.g., "scumming") of mask 442 to spacer $440_3$, as described above in conjunction with FIGS. 5B-5D.

Discontinuities 487 and 489 cause segments $492_1$, $492_2$, and $492_3$, respectively of conductive lines $460_1$, $460_2$, and $460_3$, between discontinuities 487 and 489 to float. For example, segments $492_2$ and $492_3$ would be floating, but for their coupling to contact 470 and plug 430. In other words, portions $490_1$ and $490_2$ electrically isolate segment $492_1$ and electrically isolate segments $492_2$, and $492_3$ but for their coupling to contact 470 and plug 430. Line segments 492 are located in the region (e.g., that may be called isolated region 495) between portions $490_1$ and $490_2$ of dielectric segment 454.

Note that portions of conductive lines $460_1$, $460_2$, and $460_3$ that are electrically and physically isolated from segments $492_1$, $492_2$, and $492_3$ by portion $490_1$, e.g., those portions of conductive lines $460_1$, $460_2$, and $460_3$ to the right of portion $490_1$ in FIG. 3, may be coupled to circuitry and that portions of conductive lines $460_1$, $460_2$, and $460_3$ that are electrically and physically isolated from segments $492_1$, $492_2$, and $492_3$ by portion $490_2$, e.g., those portions of conductive lines $460_1$, $460_2$, and $460_3$ to the left of portion $490_2$ in FIG. 3, may be coupled to different circuitry.

In an example, arrow 310 in FIG. 3 and dot 310' in FIG. 4F may represent the current flow in line $460_4$, where dot 310' represents current flowing out of the face plane of FIG. 4F. For example, line $460_4$ may be coupled to circuitry. The current can flow from line $460_4$ to conductive plug 430. The current can then flow through conductive plug 430 under the dielectric segment $452_3$, as shown by arrow 315 in FIGS. 3 and 4F. Note that conductive plug 430 forms a conductive underpass under the dielectric segment $452_3$ between conductive lines $460_3$ and $460_4$.

The current can then flow from conductive plug 430 to conductive line $460_3$ and then through conductive line $460_3$, as indicated by arrow 317 in FIG. 4F. The current can then flow from conductive line $460_3$ to conductive plug 470 and then through conductive plug 470 to line 480, as shown by arrow 318 in FIG. 4F and dot 318' in FIG. 3, e.g., representing current flowing out of the face plane of FIG. 3. The current can then flow through line 480 to conductive pad 485, as shown by arrow 320 in FIG. 3 and "X" 320', e.g., representing current flowing into the face plane of FIG. 4F.

Note that, in the prior art, access to a line, such as line $460_4$ in FIG. 3, would typically be accomplished in a manner similar to connecting line $210_1$ to contact $230_1$ in FIG. 2, for example. That is, the line would be enlarged to have an enlarged portion 250 with an area that is larger than contact $230_1$, and contact $210_1$ would be formed entirely within the enlarged portion 250, so that the contact $230_1$ would not short the line to adjacent lines.

The use of contact 470 and plug 430 in FIGS. 3 and 4F can eliminate the need to enlarge a portion of line $460_4$ to have an area larger than contact 470 and to form contact 470 entirely within the enlarged region, thus allowing lines 460 to remain substantially straight. Note that contact 470 in FIGS. 3 and 4F passes over dielectric segment $452_2$ and passes over and is coupled to (e.g., is in contact with) lines $460_2$ and $460_3$. However, this does not present a problem, in that lines $460_2$ and $460_3$ are floating but for their coupling to contact 470. Plug 430 passes under dielectric segment $452_3$ and is coupled to (e.g., is in contact with) lines $460_3$ and $460_4$. In other words, plug 430 passes under dielectric segment $452_3$ in order to couple line $460_4$ to line $460_3$, and thus contact 470, located in the isolated region 495. This enables contact 470 to be located in isolated floating region 495, instead of enlarging a portion of line $460_4$ and forming contact 470 entirely within the enlarged portion of line $460_4$, as is sometimes done in the prior art.

Figure 7:
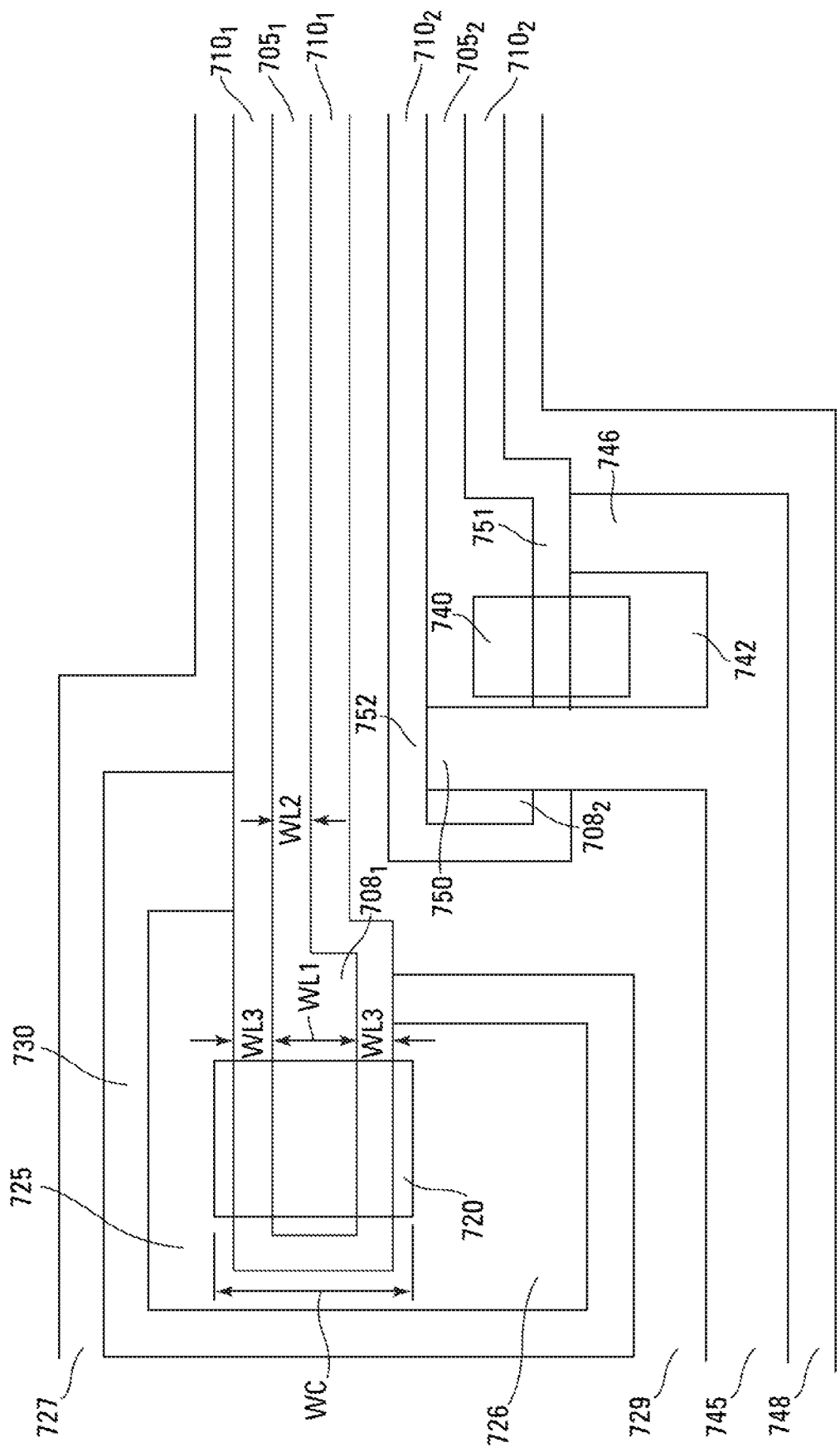
FIG. 7 is a top-down view illustrating accessing conductors in an interconnect structure of an integrated circuit using conductive overpasses, according to another embodiment.

FIG. 7 is a top-down view illustrating accessing of conductors, such as pitch-multiplied conductive lines $705_1$ and $705_2$, using conductive overpasses, in a layout, e.g., of an interconnect structure of an integrated circuit. For example, conductive lines $705_1$ and $705_2$ may respectively include enlarged regions $708_1$ and $708_2$. A dielectric (e.g., a dielectric segment $710_1$) may be on either side of line $705_1$ and may wrap around an end of line $705_1$, e.g., forming an open loop around the end of line $705_1$. A dielectric (e.g., a dielectric segment $710_2$) may be on either side of line $705_2$ and may wrap around an end of line $705_2$, e.g., forming an open loop around the end of line $705_2$. Dielectric segments 710 may correspond to spacers that were used during the formation of lines 705. Lines $705_1$ and $705_2$ may be coupled to circuitry for some embodiments.

A conductive contact 720, e.g., a conductive overpass, may be used to access line $705_1$ by contacting a top, e.g., an upper surface, of enlarged portion $708_1$. For example, the width WC of contact 720 may be greater than the width WL1 of enlarged portion $708_1$ of line $705_1$, e.g., the distance from the portions of dielectric segment $710_1$ on either side of enlarged portion $708_1$, plus the combined width 2WL3 of the portions of dielectric segment $710_1$ on the sides of enlarged portion $708_1$. Note that the width WL1 of the enlarged portion $708_1$ of line $705_1$ that is directly coupled to contact 720 is greater the width WL2 of (e.g., the distance from the portions of dielectric segment $710_1$ on either side of) a portion of line $705_1$ that is not directly coupled to contact 720.

Contact 720 may pass over the portions of dielectric segment $710_1$ on either side of enlarged portion $708_1$ and may be directly coupled to (e.g., may directly contact) a top, e.g., an upper surface, of conductors 725 and 726 on respective sides of dielectric segment $710_1$. A dielectric (e.g., a dielectric segment 730) may be used to electrically and physically isolate conductor 725 from a conductor 727 and to electrically and physically isolate conductor 726 from a conductor 729, e.g., so that conductors 725 and 726 would float but for their coupling to contact 720. In other words, conductors 725 and 726 would be electrically isolated but for their coupling to contact 720. For example, dielectric segment 730 may form discontinuities between conductor 725 and conductor 727 and between conductor 726 and conductor 729. Conductors 727 and 729 may be coupled to circuitry for some embodiments.

Dielectric segment 730 may be contiguous with (e.g., may abut) either side of dielectric segment $710_1$ respectively on either side of line 705$_1$, e.g., as a result of a mask that self-aligned ("scummed") to the spacer corresponding to dielectric segment 710$_1$, as described above in conjunction with FIGS. 5B-5D. Using contact 720 in conjunction with isolating conductors 725 and 726 that are in contact with contact 720, as the result of self-aligning the mask to the spacer corresponding to dielectric segment 710$_1$ in FIG. 7, eliminates the need for enlarging enlarged portion 708$_1$ so that a contact would fit entirely within enlarged portion 708$_1$.

A conductive contact 740, e.g., a conductive overpass, may be used to access line 705$_2$ by contacting a top, e.g., an upper surface, of enlarged portion 708$_2$. Contact 740 may pass over dielectric segment 710$_2$ on one side of enlarged portion 708$_2$ and may contact a top, e.g., an upper surface, of a conductor 742. A dielectric (e.g., a dielectric segment 745) may be used to electrically and physically isolate the conductor 742 that is in contact with contact 740, e.g., so that conductor 742 would float, but for its contact with conductive contact 740. In other words, conductor 742 would be electrically isolated, but for its contact with conductive contact 740. For example, a portion 746 of dielectric segment 745 may electrically and physically isolate a conductor 748 from conductor 742, and a portion 750 of dielectric segment 745 may electrically and physically isolate conductor 742 from conductor 729. That is, portion 746 of dielectric segment 745 may form a discontinuity between conductor 748 conductor 742, and portion 750 of dielectric segment 745 may form a discontinuity between conductor 742 and conductor 729. Conductor 748 may be coupled to circuitry for some embodiments.

Portion 746 of dielectric segment 745 may be contiguous with (e.g., may abut) a side of a portion 751 of dielectric segment 710$_2$, as a result of portion a mask that self-aligned ("scummed") to the spacer corresponding to the portion 748 of dielectric segment 710$_2$, as described above in conjunction with FIGS. 5B-5D. For example, portion 746 of dielectric segment 745 may abut portion 751 of dielectric segment 710$_2$ on an exterior of the open loop formed by wrapping dielectric segment 710$_2$ around the end of line 705$_2$.

Portion 750 of dielectric segment 745 may be contiguous with (e.g., may abut) a side of a portion 752 of dielectric segment 710$_2$, as a result of a portion a mask that extended over the spacer corresponding to the portion 751 of dielectric segment 710$_2$ and that self-aligned ("scummed") to the spacer corresponding to the portion 752 of dielectric segment 710$_2$, as described above in conjunction with FIGS. 5B-5D. For example, example, portion 750 of dielectric segment 745 may pass through portion 751 of dielectric segment 710$_2$ and through line 705$_2$, and may abut portion 752 of dielectric segment 710$_2$ in an interior of the open loop formed by wrapping dielectric segment 710$_2$ around the end of line 705$_2$. Using contact 740 in conjunction with isolating the conductor 742 that is in contact with contact 740 eliminates the need for enlarging enlarged portion 708$_2$ so that contact 740 would fit entirely within enlarged portion 708$_2$.

Figure 8:
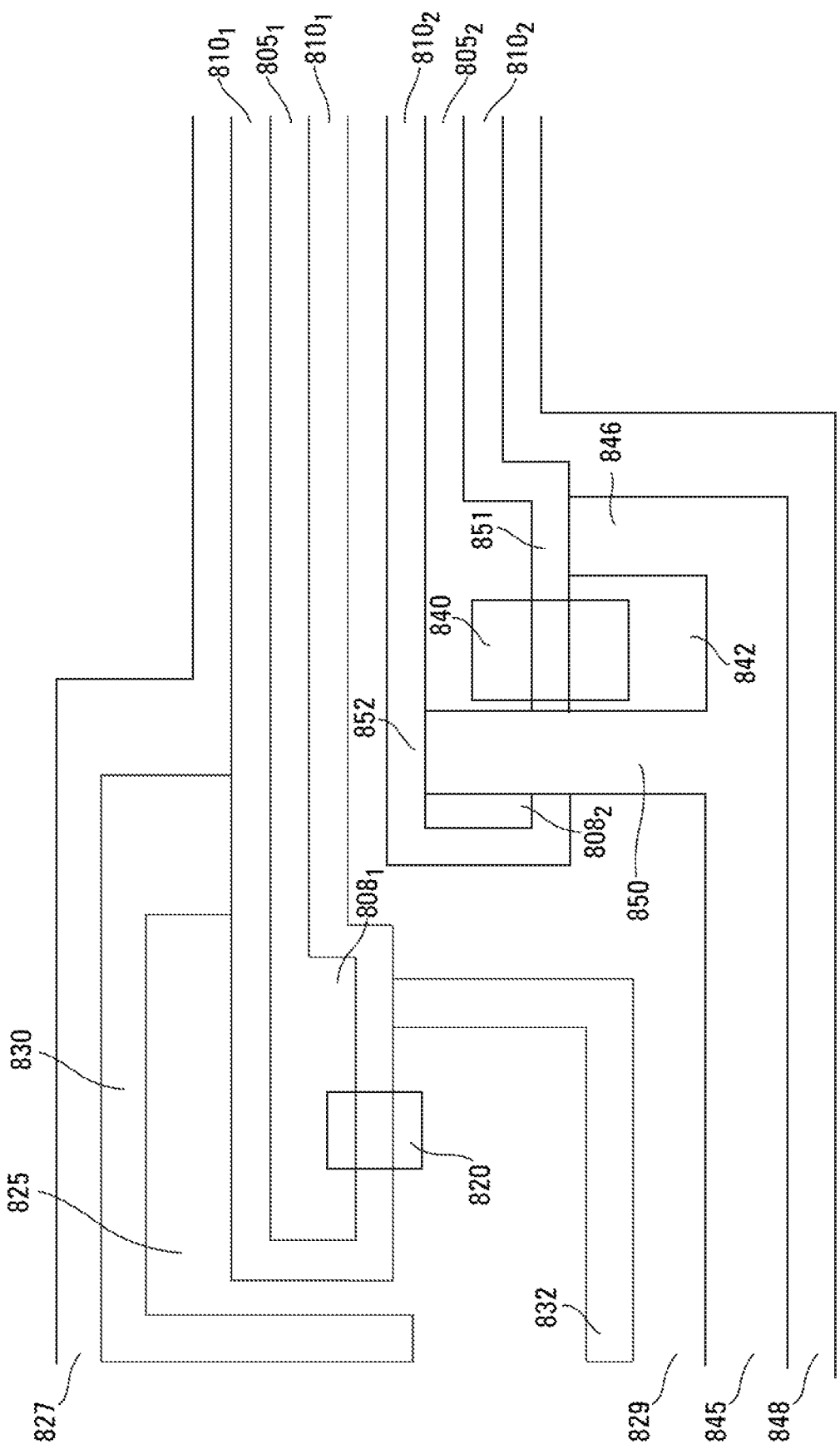
FIG. 8 is a top-down view illustrating accessing conductors in an interconnect structure of an integrated circuit using conductive underpasses, according to another embodiment.

FIG. 8 is a top-down view illustrating accessing of conductors, such as pitch-multiplied conductive lines 805$_1$ and 805$_2$, using conductive underpasses, in a layout, e.g., of an interconnect structure of an integrated circuit. For example, conductive lines 805$_1$ and 805$_2$ may respectively include enlarged regions 808$_1$ and 808$_2$. A dielectric (e.g., a dielectric segment 810$_1$) may be on either side of line 805$_1$ and may wrap around an end of line 805$_1$. A dielectric (e.g., a dielectric segment 810$_2$) may be on either side of line 805$_2$ and may wrap around an end of line 805$_2$. Dielectric segments 810 may correspond to spacers that were used during the formation of lines 805. Lines 805$_1$ and 805$_2$ may be coupled to circuitry for some embodiments.

A conductive plug 820, e.g., a conductive underpass, may be used to access line 805$_1$ by contacting the bottom, e.g., the lower surface, of enlarged portion 808$_1$. Plug 820 may pass under a portion of dielectric segment 810$_1$ on a side of enlarged portion 808$_1$ and may be directly coupled to (e.g., by direct contact with) a bottom, e.g., a lower surface, of a conductor 825. Dielectrics (e.g., dielectric segments 830 and 832) may be used to respectively electrically and physically isolate conductor 825 from conductors 827 and 829, e.g., so that conductor 825 would float (e.g., would be electrically isolated) but for its coupling to plug 820. For example, dielectric segment 830 may electrically and physically isolate conductor 825 from conductor 827 by forming a discontinuity between conductor 825 and conductor 827, and dielectric segment 832 may electrically and physically isolate conductor 825 from conductor 829 by forming a discontinuity between conductor 825 and conductor 829. Conductors 827 and 829 may be coupled to circuitry for some embodiments.

Each of dielectric segments 830 and 832 may be contiguous with (e.g., may abut) a respective side of dielectric segment 810$_1$ on a respective side of line 805$_1$, as a result of a mask that self-aligned ("scummed") to the spacers respectively corresponding to portions of dielectric segment 810$_1$ on the respective sides of line 805$_1$, as described above in conjunction with FIGS. 5B-5D.

A conductive plug 840, e.g., a conductive underpass, may be used to access line 805$_2$ by contacting the bottom, e.g., the lower surface, of enlarged portion 808$_2$. Plug 840 may pass under dielectric segment 810$_2$ on one side of enlarged portion 808$_2$ and may contact a bottom, e.g., a lower surface, of a conductor 842. A dielectric (e.g. a dielectric segment 845) may be used to electrically and physically isolate conductor 842 from conductors 829 and 846, e.g., so that conductor 842 would float (e.g., would be electrically isolated) but for its contact with plug 840. For example, a portion 846 of dielectric segment 845 may electrically and physically isolate a conductor 848 from conductor 842 by forming a discontinuity between conductor 848 and conductor 842, and a portion 850 of dielectric segment 845 may electrically and physically isolate conductor 842 from conductor 829 by forming a discontinuity between conductor 829 and conductor 842. Conductor 848 may be coupled to circuitry for some embodiments.

Portion 846 of dielectric segment 845 may be contiguous with (e.g., may abut) a side of a portion 851 of dielectric segment 810$_2$, as a result of a mask that self-aligned ("scummed") to the spacer corresponding to the portion 851 of dielectric segment 810$_2$, as described above in conjunction with FIGS. 5B-5D. Portion 850 of dielectric segment 845 may be contiguous with (e.g., may abut) a side of a portion 852 of dielectric segment 810$_2$, as a result of a mask that extended over the spacer corresponding to the portion 851 of dielectric segment 810$_2$ and that self-aligned ("scummed") to the spacer corresponding to the portion 852 of dielectric segment 810$_2$, as described above in conjunction with FIGS. 5B-5D.

Figure 9:
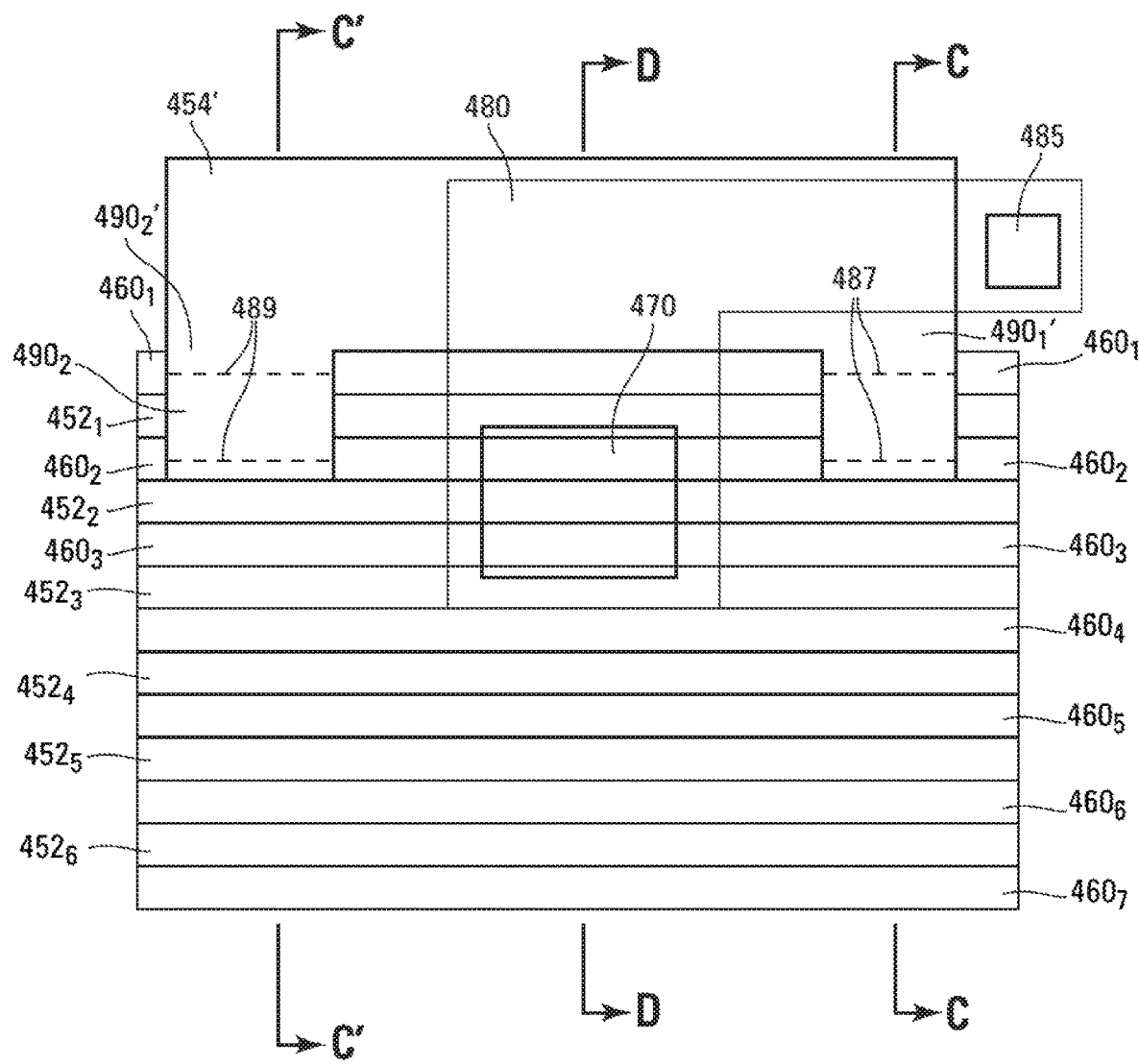
FIG. 9 is a top-down view of a layout of an interconnect structure of an integrated circuit device, according to another embodiment.
Figure 10A:
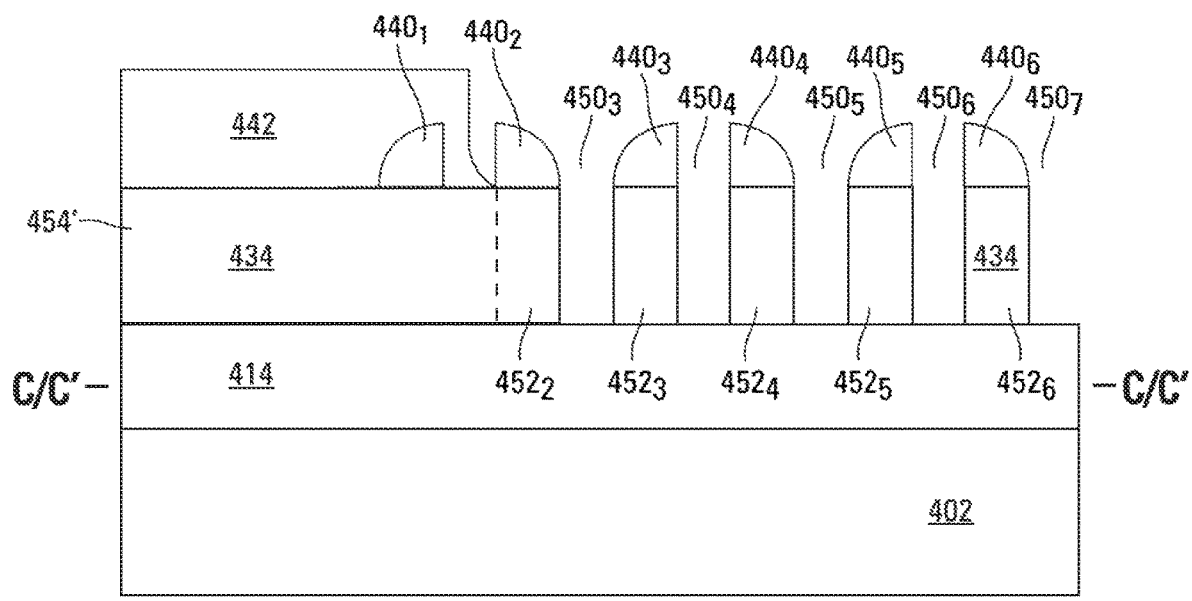
Figure 11:
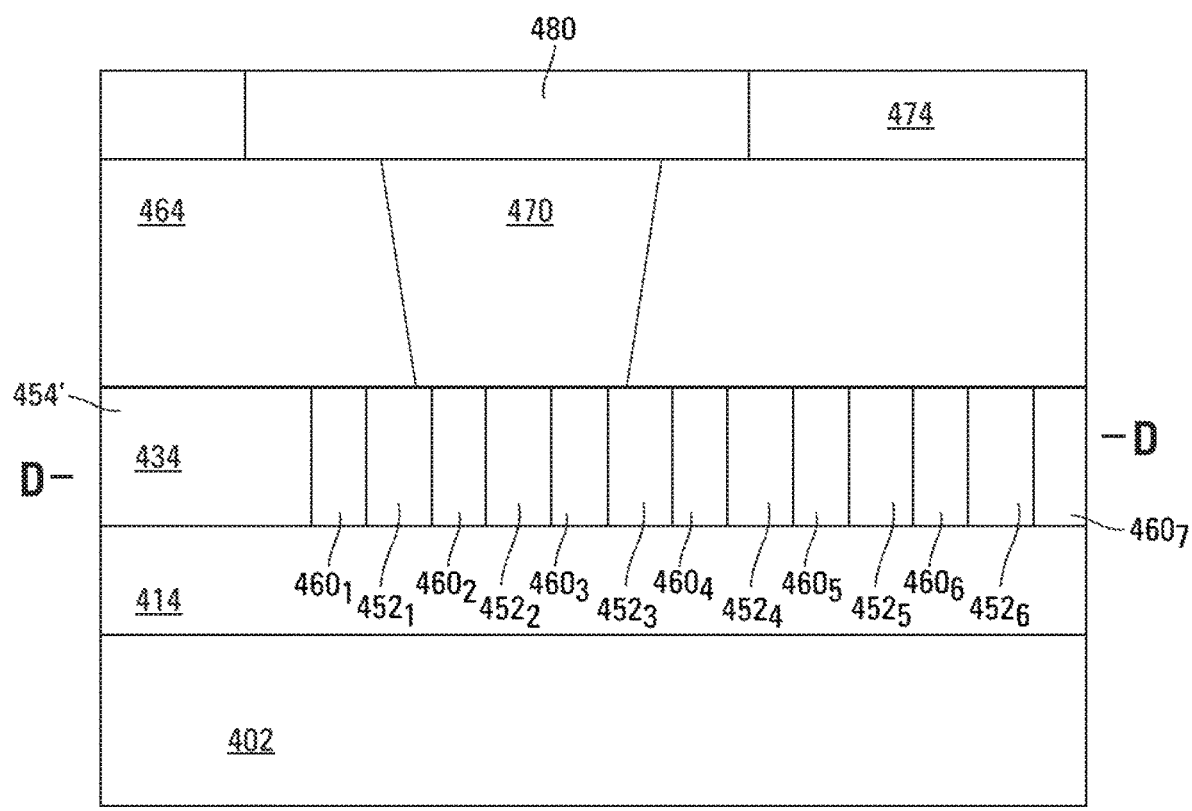
FIG. 11 shows a cross-section viewed along line D-D in FIG. 9.

For some embodiments, conductive plugs 410 and 430 may be omitted from FIGS. 4A-4F, as is shown in FIGS. 9 and 11, e.g., where FIGS. 9, 10A, 10B, and 11 are respectively analogous to FIGS. 3, 5D, 5F, and 4F. Common numbering is used in FIGS. 9, 10A, 10B, and 11 and in FIGS. 3, 5D, 5F, and 4F to denote similar components (e.g., the same components), which are described above in conjunction with FIGS. 3, 5D, 5F, and 4F.

FIG. 9 is a top-down view, FIGS. 10A-10B show a cross-section viewed along lines C-C and C'-C' in FIG. 9 during various stages of fabrication, and FIG. 11 shows a cross-section viewed along line D-D in FIG. 9. In FIGS. 9 and 11, contact 470 is coupled to line $460_3$, e.g., that may be coupled to circuitry. Portions $490_1{'}$ and $490_2{'}$ of mask segment 454' in FIG. 9 may be contiguous with (e.g., may abut) sides of dielectric $452_2$.

Further in FIGS. 9 and 11, contact 470 may be over and coupled to (e.g., by direct contact with) upper (e.g., top) surfaces of lines $460_2$ and $460_3$. Contact 470 passes over dielectric $452_2$, which is between lines $460_2$ and $460_3$. For some embodiments, lines $460_3$ and $460_2$ and dielectric $452_2$ remain substantially straight (e.g., straight) where contact 470 is coupled thereto, which is in contrast to the prior art. Line $460_2$ is between portions $490_1{'}$ and $490_2{'}$ of mask segment 454', and portions $490_1{'}$ and $490_2{'}$ would electrically isolate line $460_2$ but for its coupling to contact 470. For example, line $460_2$ would float but for its coupling to contact 470.

Portions $490_1{'}$ and $490_2{'}$ may be formed by self-aligning (e.g., "scumming") mask 442 to spacer $440_2$, as shown in FIG. 10A, and described above in conjunction with FIGS. 5C and 5D. For example, mask 442 is now self-aligned to spacer $440_2$ instead of spacer $440_3$ in FIGS. 5C and 5D. This allows line $460_3$ to be formed in space $450_3$ in FIG. 10A in addition to space $450_3$ in FIG. 4D, so that line $460_3$ is continuous, e.g., without breaks, in FIG. 9, and thus line $460_3$ appears both in FIGS. 10B and 11.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of forming an integrated circuit, comprising:
   forming a first conductive structure at a first level of the integrated circuit;
   forming a first conductor at a second level of the integrated circuit to be in physical and electrical contact with the first conductive structure;
   forming a second conductor at the second level to be in physical and electrical contact with the first conductive structure, and to be parallel to the first conductor;
   forming a third conductor at the second level to be electrically isolated from the first conductive structure and electrically isolated from any other conductive structure formed at the first level, and to be parallel to the first conductor and to the second conductor; and
   forming a second conductive structure at a third level of the integrated circuit to be in physical and electrical contact with the second conductor and with the third conductor, wherein the second level is between the first level and the third level.

2. The method of claim 1, wherein forming the first conductor, forming the second conductor and forming the third conductor comprises forming the first conductor to have a length greater than a length of the second conductor and greater than a length of the third conductor, and forming the second conductor and the third conductor to be parallel to each other over their entire respective lengths.

3. The method of claim 2, further comprising forming the second conductor and the third conductor to be parallel to only a portion of the respective length of the first conductor.

4. The method of claim 1, wherein forming the third conductor comprises forming the third conductor to have no physical contact with the first conductive structure.

5. The method of claim 4, wherein forming the second conductive structure comprises forming the second conductive structure to have no physical contact with the first conductor.

6. The method of claim 1, wherein forming the first conductive structure at the first level comprises forming the first conductive structure in a first dielectric at the first level.

7. A method of forming an integrated circuit, comprising:
   forming a first conductive structure at a first level of the integrated circuit;
   concurrently forming a first conductor, a second conductor and a third conductor at a second level of the integrated circuit and parallel to each other, wherein forming the first conductor and the second conductor comprises forming the first conductor and the second conductor to each be in physical and electrical contact with the first conductive structure, wherein forming the third conductor comprises forming the third conductor on a dielectric formed at the first level and to be electrically isolated from the first conductive structure, and wherein physical contact between the third conductor and the first level consists of physical contact between the third conductor and the dielectric; and
   forming a second conductive structure at a third level of the integrated circuit to be in physical and electrical contact with the second conductor and with the third conductor, wherein the second level is between the first level and the third level.

8. The method of claim 7, wherein forming the first conductor, forming the second conductor and forming the third conductor comprises forming the first conductor to have a length greater than a length of the second conductor and greater than a length of the third conductor, and forming the second conductor and the third conductor to be parallel to each other over their entire respective lengths.

9. The method of claim 8, further comprising forming the second conductor and the third conductor to be parallel to only a portion of the respective length of the first conductor.

10. The method of claim 9, further comprising forming the second conductor and the third conductor to have a particular width over their entire respective lengths, and forming the first conductor to have the particular width along the portion of its respective length parallel to the second conductor and the third conductor.

11. The method of claim 10, further comprising forming the first conductor to have a different width, greater than the particular width, along a different portion of its respective length.

12. The method of claim 7, wherein forming the second conductive structure comprises forming the second conductive structure to have no physical contact with the first conductor.

13. The method of claim 7, wherein forming the first conductive structure at the first level comprises forming the first conductive structure on a conductive plug at a fourth level of the integrated circuit, and wherein the first level is between the second level and the fourth level.

14. The method of claim 7, further comprising:
forming a fourth conductor at the second level concurrently with forming the first conductor, the second conductor and the third conductor;
wherein the fourth conductor is formed to be parallel to the first conductor, to the second conductor and to the third conductor; and
wherein the fourth conductor is formed to be electrically isolated from the first conductive structure.

15. A method of forming an integrated circuit, comprising:
forming a first conductive structure at a first level of the integrated circuit;
concurrently forming a first conductor, a second conductor, a third conductor and fourth conductor at a second level of the integrated circuit and parallel to each other, wherein forming the first conductor and the second conductor comprises forming the first conductor and the second conductor to each be in physical and electrical contact with the first conductive structure, wherein forming the third conductor comprises forming the third conductor to be electrically isolated from the first conductive structure, and wherein forming the fourth conductor comprises forming the fourth conductor to be electrically isolated from the first conductive structure; and
forming a second conductive structure at a third level of the integrated circuit to be in physical and electrical contact with the second conductor and with the third conductor, and to be electrically isolated from the fourth conductor, wherein the second level is between the first level and the third level.

16. A method of forming an integrated circuit, comprising:
forming a first conductive structure at a first level of the integrated circuit;
forming a first conductor having a first length at a second level of the integrated circuit to be in physical and electrical contact with the first conductive structure;
forming a second conductor having a second length, less than the first length, at the second level to be in physical and electrical contact with the first conductive structure, and to be parallel to the first conductor;
forming a third conductor having the second length at the second level to be electrically isolated from the first conductive structure, and to be parallel to the first conductor and to the second conductor; and
forming a second conductive structure at a third level of the integrated circuit to be in physical and electrical contact with the second conductor and with the third conductor, wherein the second level is between the first level and the third level;
wherein forming the second conductor and forming the third conductor comprises forming the second conductor and the third conductor to have a particular width along the second length;
wherein forming the first conductor comprises forming the first conductor to have the particular width along a portion of the first length that is parallel to the second conductor and to the third conductor; and
wherein forming the second conductive structure to be in physical and electrical contact with the third conductor comprises forming the second conductive structure to be the only physical and electrical contact to the third conductor.

17. A method of forming an integrated circuit, comprising:
forming a first conductive structure at a first level of the integrated circuit;
forming a first conductor having a first length at a second level of the integrated circuit to be in physical and electrical contact with the first conductive structure;
forming a second conductor having a second length, less than the first length, at the second level to be in physical and electrical contact with the first conductive structure, and to be parallel to the first conductor;
forming a third conductor having the second length at the second level to be electrically isolated from the first conductive structure, and to be parallel to the first conductor and to the second conductor;
forming a fourth conductor having the second length at the second level to be electrically isolated from the first conductive structure, and to be parallel to the first conductor, to the second conductor and to the third conductor;
forming a second conductive structure at a third level of the integrated circuit to be in physical and electrical contact with the second conductor and with the third conductor, and to be electrically isolated from the fourth conductor;
wherein forming the second conductor, forming the third conductor and forming the fourth conductor comprises forming the second conductor, the third conductor and the fourth conductor to have a particular width along the second length; and
wherein forming the first conductor comprises forming the first conductor to have the particular width along a portion of the first length that is parallel to the second conductor, to the third conductor and to the fourth conductor.

18. The method of claim 17, wherein forming the fourth conductor comprises forming the fourth conductor to be electrically floating in the integrated circuit.

19. The method of claim 16, wherein forming the first conductor, forming the second conductor and forming the third conductor comprises concurrently forming the first conductor, the second conductor and the third conductor.

20. The method of claim 16, wherein forming the first conductor further comprises forming the first conductor to have a different width, greater than the particular width, along a different portion of the first length.

* * * * *